US012596413B2

(12) United States Patent (10) Patent No.: US 12,596,413 B2

Austin et al. (45) Date of Patent: Apr. 7, 2026

(54) CONTROL SCHEME FOR REGULATING THERMOELECTRIC COOLING DEVICE POWER FOR A COMPUTING DEVICE

(71) Applicant: ADVANCED MICRO DEVICES, INC., Santa Clara, CA (US)

(72) Inventors: Michael J. Austin, Austin, TX (US); Christopher M. Helberg, Austin, TX (US); Sukesh Shenoy, Austin, TX (US); Christopher M. Jaggers, Austin, TX (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 88 days.

(21) Appl. No.: 17/956,821

(22) Filed: Sep. 29, 2022

(65) Prior Publication Data

US 2024/0111344 A1 Apr. 4, 2024

(51) Int. Cl.
*G06F 1/20* (2006.01)
*H05K 7/20* (2006.01)

(52) U.S. Cl.
CPC ........... *G06F 1/206* (2013.01); *H05K 7/2039* (2013.01)

(58) Field of Classification Search
CPC .............. G06F 1/206; G06F 2200/201; G06F 2200/202; G06F 2200/203; H05K 7/2039; H05K 7/205
See application file for complete search history.

(56) References Cited

U.S. PATENT DOCUMENTS

| | | | |
|---|---|---|---|
| 4,607,492 A | 8/1986 | Demus et al. |
| 6,084,771 A | 7/2000 | Ranchy et al. |
| 6,542,365 B2 | 4/2003 | Inoue |
| 6,845,012 B2 | 1/2005 | Ohkouchi |
| 7,027,302 B2 | 4/2006 | Inoue |
| 7,106,592 B2 | 9/2006 | Inoue et al. |
| 7,240,722 B2 | 7/2007 | Lai et al. |
| 7,248,478 B2 | 7/2007 | Inoue |
| 7,250,674 B2 | 7/2007 | Inoue |
| 7,298,618 B2 | 11/2007 | Campbell et al. |
| 7,400,504 B2 | 7/2008 | Campbell et al. |
| 7,408,776 B1 | 8/2008 | Campbell et al. |
| 7,591,302 B1 | 9/2009 | Lenehan et al. |

(Continued)

FOREIGN PATENT DOCUMENTS

| | | |
|---|---|---|
| DE | 202008013995 U1 | 12/2008 |
| EP | 0498753 A2 | 8/1992 |

(Continued)

OTHER PUBLICATIONS

International Search Report and Written Opinion, PCT/US2023/073736, Dec. 14, 2023, 11 pages.

(Continued)

*Primary Examiner* — Hyun Soo Kim

(57) ABSTRACT

An apparatus for component cooling includes a thermoelectric cooling (TEC) device configured to be thermally coupled to a first processor, and a controller. The controller is configured to receive at least one first parameter indicative of a first activity level of the first processor; determine a TEC power level from among a plurality of TEC power levels based on the at least one first parameter; and control providing of power to the TEC device at the determined TEC power level.

19 Claims, 17 Drawing Sheets

(56) References Cited

U.S. PATENT DOCUMENTS

| | | | |
|---|---|---|---|
| 7,639,498 B2 | 12/2009 | Campbell et al. | |
| 7,830,664 B2 | 11/2010 | Campbell et al. | |
| 8,668,189 B2 | 3/2014 | Guthrie | |
| 9,157,687 B2 | 10/2015 | Schon | |
| 9,313,919 B2 | 4/2016 | Aoki et al. | |
| 10,602,640 B1 | 3/2020 | Tsai et al. | |
| 10,694,638 B1 | 6/2020 | Lin et al. | |
| 10,775,861 B2 | 9/2020 | North et al. | |
| 11,547,022 B2 | 1/2023 | Gao | |
| 2003/0183269 A1* | 10/2003 | Maeda | G06F 1/203 |
| | | | 136/211 |
| 2006/0001140 A1* | 1/2006 | Lee | H01L 24/40 |
| | | | 257/E25.013 |
| 2006/0090474 A1 | 5/2006 | Sauciuc et al. | |
| 2006/0278372 A1 | 12/2006 | Lai et al. | |
| 2007/0034356 A1 | 2/2007 | Kenny et al. | |
| 2007/0074853 A1 | 4/2007 | Popovich | |
| 2007/0091570 A1 | 4/2007 | Campbell et al. | |
| 2007/0234740 A1 | 10/2007 | Lee et al. | |
| 2008/0052428 A1 | 2/2008 | Liang et al. | |
| 2008/0084668 A1 | 4/2008 | Campbell et al. | |
| 2008/0174962 A1 | 7/2008 | Belady et al. | |
| 2008/0184710 A1 | 8/2008 | DeVilbiss | |
| 2008/0259567 A1 | 10/2008 | Campbell et al. | |
| 2010/0101756 A1 | 4/2010 | Chu et al. | |
| 2011/0320055 A1* | 12/2011 | Yamachi | G06F 1/206 |
| | | | 700/291 |
| 2013/0027884 A1 | 1/2013 | Campbell et al. | |
| 2013/0056186 A1 | 3/2013 | Schalansky | |
| 2014/0231057 A1 | 8/2014 | Schalansky | |
| 2014/0237815 A1 | 8/2014 | Lau et al. | |
| 2015/0062824 A1* | 3/2015 | Hyun | H01L 23/34 |
| | | | 361/716 |
| 2015/0233647 A1 | 8/2015 | Quisenberry et al. | |
| 2016/0033974 A1 | 2/2016 | North et al. | |
| 2016/0334845 A1* | 11/2016 | Mittal | H10N 19/00 |
| 2017/0038805 A1* | 2/2017 | Chun | G06F 3/0604 |
| 2017/0191709 A1 | 7/2017 | Chen et al. | |
| 2018/0004259 A1 | 1/2018 | Kulkarni et al. | |
| 2018/0206365 A1* | 7/2018 | Norton | H05K 7/20727 |
| 2020/0363104 A1* | 11/2020 | MacDonald | G06F 1/20 |
| 2021/0045254 A1 | 2/2021 | Zhang et al. | |
| 2021/0084791 A1 | 3/2021 | Bucher | |
| 2022/0007541 A1 | 1/2022 | Shaw et al. | |
| 2022/0113757 A1 | 4/2022 | Yan et al. | |
| 2022/0167526 A1 | 5/2022 | Xu et al. | |
| 2022/0214730 A1 | 7/2022 | Navarro et al. | |
| 2022/0256684 A1 | 8/2022 | Gao | |
| 2022/0369517 A1 | 11/2022 | Gao | |
| 2023/0009853 A1* | 1/2023 | Kim | G06F 1/324 |
| 2023/0083995 A1 | 3/2023 | Wang et al. | |
| 2023/0096875 A1 | 3/2023 | Edmunds et al. | |
| 2023/0348106 A1* | 11/2023 | Berthelet | B64U 70/97 |
| 2024/0057296 A1 | 2/2024 | Gary et al. | |
| 2024/0111269 A1 | 4/2024 | Jaggers et al. | |
| 2024/0111343 A1 | 4/2024 | Pratapgarhwala et al. | |
| 2024/0114646 A1 | 4/2024 | Jaggers et al. | |
| 2024/0114657 A1 | 4/2024 | Helberg et al. | |
| 2024/0114658 A1 | 4/2024 | Helberg et al. | |
| 2024/0114664 A1 | 4/2024 | Radke | |
| 2024/0332127 A1* | 10/2024 | Lee | H10N 10/8556 |

FOREIGN PATENT DOCUMENTS

| | | | |
|---|---|---|---|
| EP | 1679744 A1 | 7/2006 | |
| KR | 20190035151 A | 4/2019 | |
| WO | 2011030976 A1 | 3/2011 | |
| WO | 2024073225 A1 | 4/2024 | |
| WO | 2024073227 A1 | 4/2024 | |

OTHER PUBLICATIONS

International Search Report and Written Opinion, PCT/US2023/073762, Jan. 3, 2024, 13 pages.

Chi et al., Study on heat pipe assisted thermoelectric power generation system from exhaust gas, Heat Mass Transfer (2017) 53:3295-3304, DOI: 10.1007/s00231-017-2046-z, Published: Apr. 19, 2017, 10 pages.

* cited by examiner

100

600

900

904C

902C

902A

902D

904B

904A

902B

1000

600

700

1100

1300

1400

1500

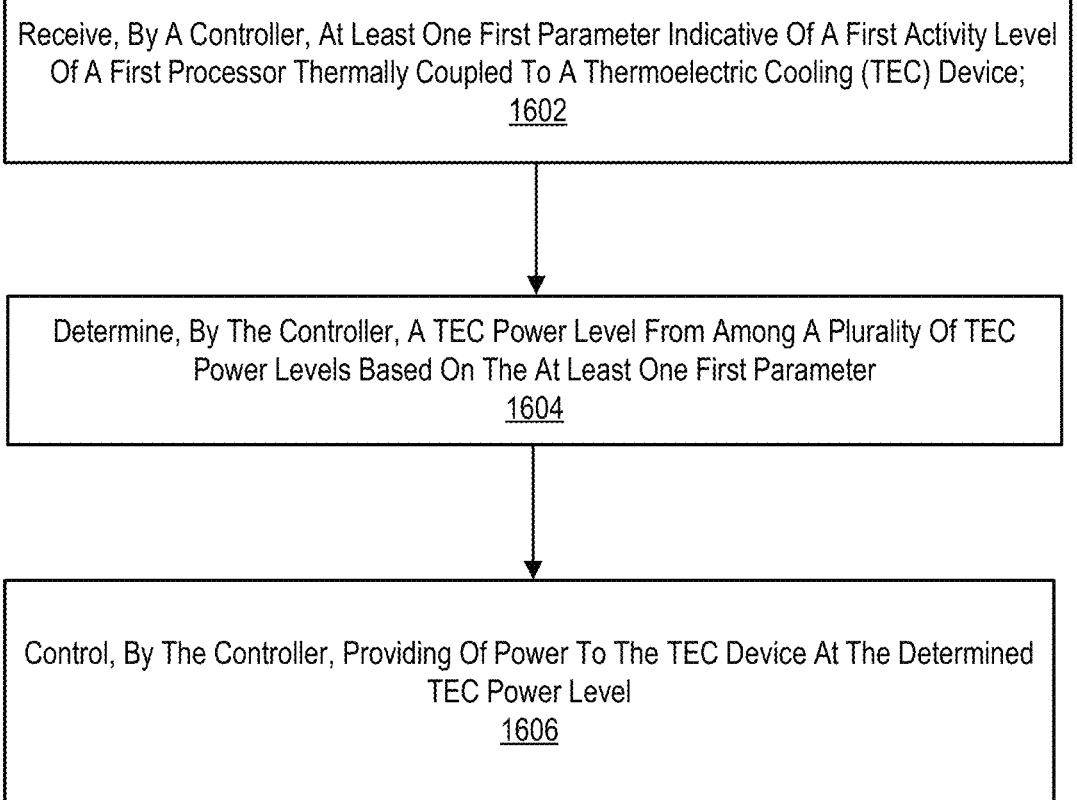

Receive, By A Controller, At Least One First Parameter Indicative Of A First Activity Level Of A First Processor Thermally Coupled To A Thermoelectric Cooling (TEC) Device;
1602

Determine, By The Controller, A TEC Power Level From Among A Plurality Of TEC Power Levels Based On The At Least One First Parameter
1604

Control, By The Controller, Providing Of Power To The TEC Device At The Determined TEC Power Level
1606

FIG. 16

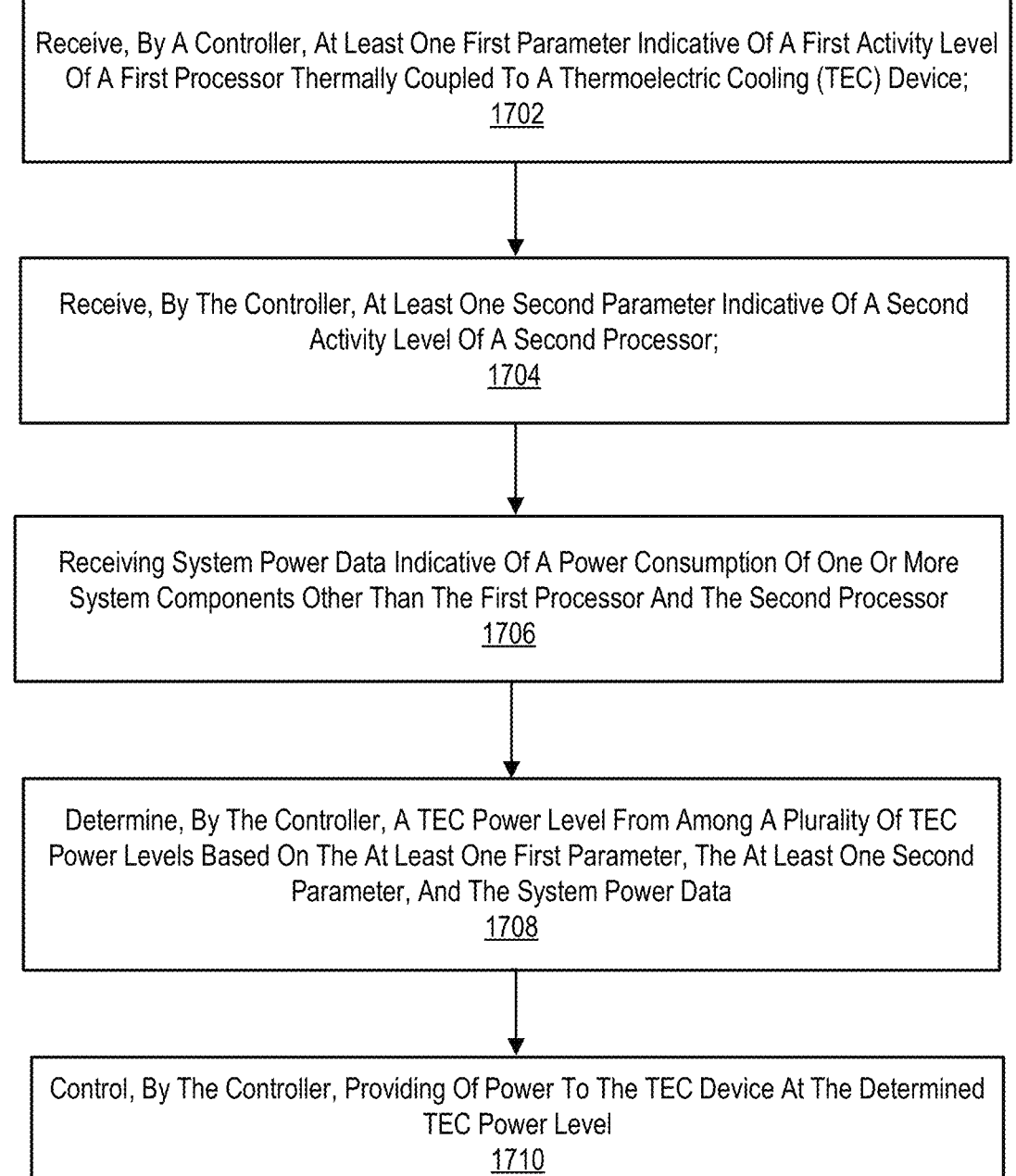

Receive, By A Controller, At Least One First Parameter Indicative Of A First Activity Level Of A First Processor Thermally Coupled To A Thermoelectric Cooling (TEC) Device;
1702

Receive, By The Controller, At Least One Second Parameter Indicative Of A Second Activity Level Of A Second Processor;
1704

Receiving System Power Data Indicative Of A Power Consumption Of One Or More System Components Other Than The First Processor And The Second Processor
1706

Determine, By The Controller, A TEC Power Level From Among A Plurality Of TEC Power Levels Based On The At Least One First Parameter, The At Least One Second Parameter, And The System Power Data
1708

Control, By The Controller, Providing Of Power To The TEC Device At The Determined TEC Power Level
1710

FIG. 17

CONTROL SCHEME FOR REGULATING THERMOELECTRIC COOLING DEVICE POWER FOR A COMPUTING DEVICE

BACKGROUND

Computing devices implement one or more cooling elements to transfer and dissipate heat generated by various components, including processors, graphics processing units (GPUs), and the like. Such cooling elements include, for example, fluid-cooled systems, heat pipes, vapor chambers, heat sinks, fans, thermoelectric cooling devices, and the like.

BRIEF DESCRIPTION OF THE DRAWINGS

FIG. 16 sets forth a flow chart illustrating an example method for component cooling according to some implementations.

FIG. 17 sets forth a flow chart illustrating another example method for component cooling according to some implementations.

DETAILED DESCRIPTION

Figure 1:
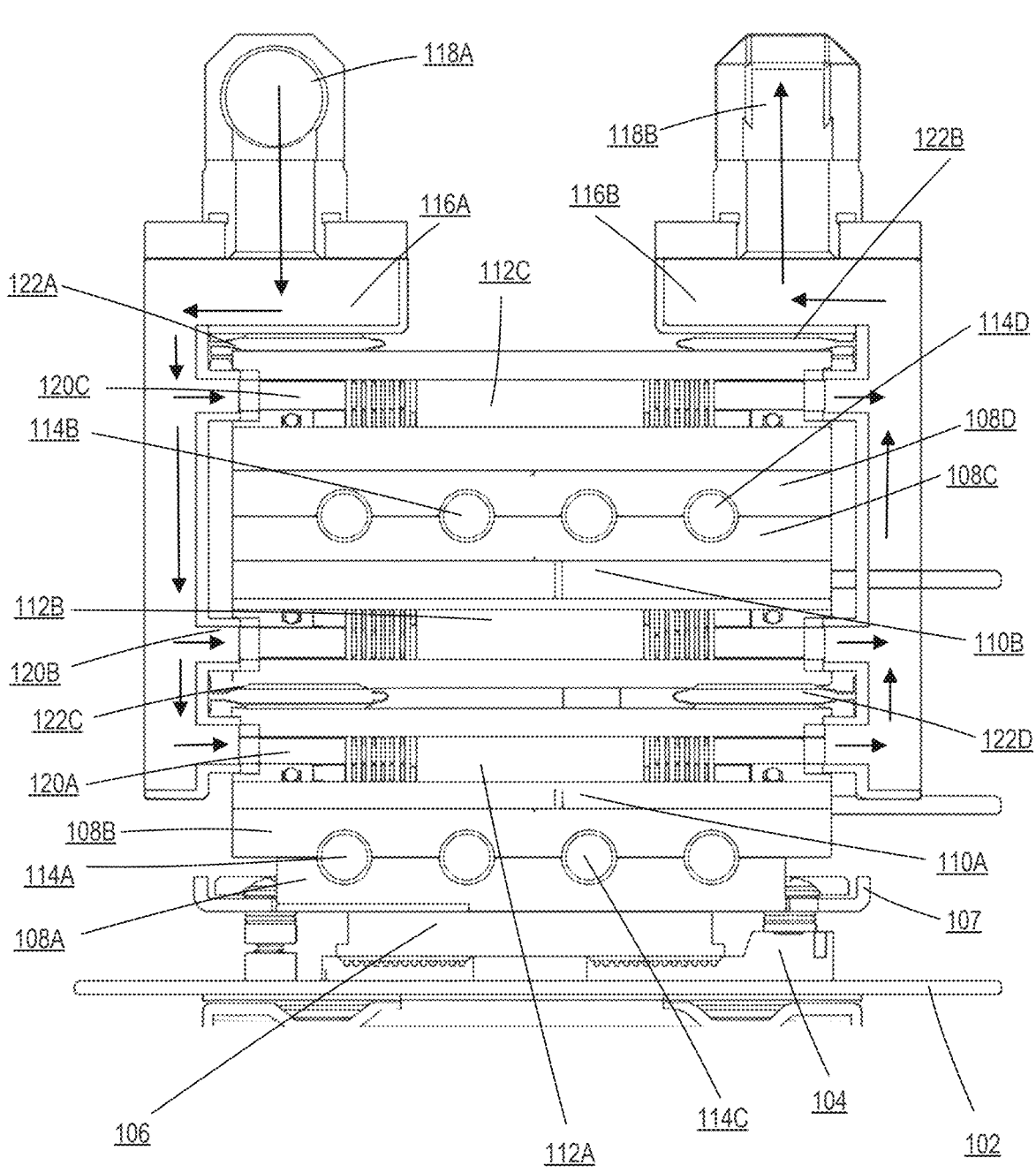
FIG. 1 is a diagram of a non-limiting example component cooling apparatus according to some implementations of the present disclosure.

Removing heat from a processor, for example a central processing unit (CPU), accelerated processing unit (APU), or a graphics processing unit (GPU) is becoming increasingly more difficult with the increased demand for greater processing power. A continuous push exists to increase power consumption and power density in integrated circuit (IC) circuitry because higher power consumption by a processor often equates to higher performance. In addition, as processor technology advances, the number of transistors and transistor density in a processor generally increases resulting in faster and more power efficient processors. As transistor density in a processor increases, heat generation is more concentrated in an area and removal of heat from the semiconductor becomes more difficult.

Thermal cooling solutions are usually employed to assist in heat removal from processors. Maintaining a cooler processor potentially equates to higher performance. More efficient thermal solutions for removing heat, e.g., a cooler, typically result in lower processor temperatures. Computing devices often include one or more cooling elements to dissipate heat generated by various components, such as processor cores. Such cooling elements include, for example, heat sinks, fluid cooling systems (e.g., water cooling systems), vapor chambers, heat pipes, fans, and the like to conduct heat to fans that dissipate the heat out of the computing device. However, existing solutions may not adequately cool components of a computing system.

Various implementations describe a component cooler for a computing device. In one or more implementations the component cooler utilizes multiple heat pipes to split a heat load generated by a component, such as a processor, by providing multiple conduction paths between multiple heat transfer surfaces to facilitate heat removal from the component. In some implementations, the component cooler includes multiple fluid flow paths across multiple surfaces to facilitate heat removal from the component. In some implementations, the component cooler utilizes one or more thermoelectric coolers (TECs) in contact with one or more heat transfer surfaces to provide sub-ambient cooling to the heat transfer surfaces to facilitate heat removal from the component. In some implementations, the component cooler utilizes thermal control features to control aspects of the operation of the component cooler to facilitate heat removal from the component. In some implementations, power provided to one or more TECs of a component cooler is controlled to adapt the cooling capability of the component cooler to suit a variety of workload use cases.

In some implementations, an apparatus for component cooling includes a thermoelectric cooling (TEC) device configured to be thermally coupled to a first processor, and a controller. The controller is configured to: receive at least one first parameter indicative of a first activity level of the first processor; determine a TEC power level from among a plurality of TEC power levels based on the at least one first parameter; and control providing of power to the TEC device at the determined TEC power level.

In some implementations, the TEC device is configured to transfer an amount of heat from the first processor to a heat transfer element based on the determined TEC power level. In some implementations, the controller is further configured to receive at least one second parameter indicative of a second activity level of a second processor. In some implementations, the controller is further configured to determine the TEC power level based on the at least one second parameter. In some implementations, the controller is further configured to receive system power data indicative of a power consumption of one or more system components other than the first processor and the second processor. In some implementations, the controller is further configured to determine the TEC power level based on the system power data.

In some implementations, the controller is further configured to: determine, using a first control loop, that total system power exceeds a first power budget, and throttle power provided to the first processor based on the determination that the total system power exceeds the first power budget. In some implementations, the controller is further configured to: determine, using a second control loop, that total system power exceeds a second power budget, and throttle power provided to at least one of the TEC device, the first processor, and the second processor based on the determination that the total system power exceeds the second power budget.

In some implementations, the first processor includes at least one of a central processing unit (CPU) and an accelerated processing unit (APU). In some implementations, the second processor includes a graphics processing unit (GPU). In some implementations, the at least one first parameter includes at least one of a first temperature associated with the first processor and a first power consumption of the first processor.

In some implementations, a system includes a first processor, a thermoelectric cooling (TEC) device configured to be thermally coupled to the first processor, a second processor; a power supply, and a controller. The controller is configured to: receive at least one first parameter indicative of a first activity level of the first processor; receive at least one second parameter indicative of a second activity level of the second processor; determine a TEC power level from among a plurality of TEC power levels based on the at least one first parameter and the at least one second parameter; and control providing of power to the TEC device from the power supply at the determined TEC power level.

In some implementations, the TEC device is configured to transfer an amount of heat from the first processor to a heat transfer element based on the determined TEC power level. In some implementations, the controller is further configured to receive system power data indicative of a power consumption of one or more system components other than the first processor and the second processor. In some implementations, the controller is further configured to determine the TEC power level based on the system power data.

In some implementations, the first processor includes at least one of a central processing unit (CPU) and an accelerated processing unit (APU), and the second processor includes a graphics processing unit (GPU).

In some implementations, a method for component cooling includes receiving, by a controller, at least one first parameter indicative of a first activity level of a first processor thermally coupled to a thermoelectric cooling (TEC) device; determining, by the controller, a TEC power level from among a plurality of TEC power levels based on the at least one first parameter; and controlling, by the controller, providing of power to the TEC device at the determined TEC power level.

In some implementations, the method further includes receiving, by the controller, at least one second parameter indicative of a second activity level of a second processor; wherein the determining of the TEC power level further based on the at least one second parameter.

In some implementations, the further includes receiving system power data indicative of a power consumption of one or more system components other than the first processor and the second processor, wherein the determining of the TEC power level is further based on the system power data.

In some implementations, the method further includes determining, using a first control loop, that total system power exceeds a first power budget; and throttling power provided to the first processor based on the determination that the total system power exceeds the first power budget.

In some implementations, the method further includes determining, using a second control loop, that total system power exceeds a second power budget; and throttling power provided to at least one of the TEC device, the first processor, and the second processor based on the determination that the total system power exceeds the second power budget.

Various implementations of a component cooling apparatus are described with reference to drawings beginning with FIG. 1. FIG. 1 is a diagram of a non-limiting example component cooling apparatus 100 according to some implementations of the present disclosure. The example component cooling apparatus 100 of FIG. 1 is shown in a cross-sectional view. The example component cooling apparatus 100 can be implemented in a variety of computing devices including desktop computing devices, mobile computing devices, laptops, tablets, hybrid laptop/tablet computing devices, gaming devices, set top boxes, and the like.

The example component cooling apparatus 100 of FIG. 1 includes a substrate 102 coupled to an integrated circuit (IC) socket 104 which is further coupled to a bottom surface of a processor 106. The substrate 102 includes, for example, a printed circuit board (PCB) such as a motherboard of a computing device. In various examples, the processor 106 includes one or more of a CPU, an APU, or a GPU. A top surface the processor 106 is thermally coupled to a bottom surface of a first base plate 108A. The first base plate 108A is connected to the substrate 102 via a mounting plate 107. A top surface of the first base plate 108A is coupled to a bottom surface of a second base plate 108B. In one or more implementations, the first base plate 108A and the second base plate 108B are constructed of a conductive metal such as copper. In an implementation, the first base plate 108A and the second base plate 108B are replaced with a single base plate. A top surface of the second base plate 108B is thermally coupled to a bottom surface of a first TEC 110A. A TEC is a semiconductor device having two sides which function to transfer heat from one side to the other when current is passed through the TEC. A top surface of the first TEC 110A is thermally coupled to a first cold plate 112A. A cold plate is a device that uses a fluid to transfer heat from a device to a remote heat exchanger. Although various implementations are described as using cold plates as heat transfer surfaces, in other implementations other suitable heat transfer surfaces are used such as base plates or heatsinks.

The component cooling apparatus 100 further includes a second cold plate 112B having a top surface thermally coupled to a bottom surface of a second TEC 110B. A top surface of the second TEC 110B is thermally coupled to a bottom surface of a third base plate 108C. A top surface of third base plate 108C is coupled to a bottom surface of a fourth base plate 108D. In one or more implementations, the third base plate 108C and the fourth base plate 108D are constructed of a conductive metal such as copper. In an implementation, the third base plate 108C and the fourth base plate 108D are replaced with a single base plate. The component cooling apparatus further includes a third cold plate 112C having a bottom surface thermally coupled to a top surface of the fourth base plate 108D. In an implementation, each of the first cold plate 112A, the second cold plate 112B, and the third cold plate 112C include a plurality of fins to facilitate transfer of heat to a heat transfer medium such as air of a fluid.

The component cooling apparatus 100 further includes multiple heat pipes 114A, 114B, 114C, and 114D. Each of the heat pipes 114A-114D has a first end disposed between and in thermal contact with the first base plate 108A and the second base plate 108B, and a second end disposed between and in thermal contact with the third base plate 108C and the fourth base plate 108D. Each of the heat pipes 114A, 114B, 114C, and 114D include a middle portion between the first end and the second end that is external to each of the base plates 108A, 108B, 108C, and 108D. In one or more implementations, each of the heat pipes 114A, 114B, 114C, and 114D are formed in a half-loop configuration as further illustrated in FIG. 2. In the implementation illustrated in FIG. 1, the heat pipes 114A-114D have a substantially circular cross section. In a particular implementation, the heat pipes 114A and 114C extend from a side of the component cooling apparatus 100, and the heat pipes 114B and 114D extend from an opposite side of the component cooling apparatus 100. Although various implementations are described as using heat pipes as heat transfer structures, other implementations utilize other suitable heat transfer structures such as vapor chambers.

The component cooling apparatus 100 further includes a fluid manifold including a manifold inlet portion 116A and a manifold outlet portion 116B disposed on opposing sides of the component cooling apparatus 100. The manifold inlet portion 116A includes a fluid inlet 118A, and the manifold outlet portion 116B includes a fluid outlet 118B. In an implementation, the fluid inlet 118A and the fluid outlet 118B are each positioned in opposite directions. In other implementations, the fluid inlet 118A and the fluid outlet 118B are each positioned in any desired direction. The fluid manifold includes a first fluid passage 120A extending from the manifold inlet portion 116A to the manifold outlet portion 116B and in thermal contact with the first cold plate 112A. The fluid manifold includes a second fluid passage 120B extending from the manifold inlet portion 116A to the manifold outlet portion 116B and in thermal contact with the second cold plate 112B. The fluid manifold further includes a third fluid passage 120C extending from the manifold inlet portion 116A to the manifold outlet portion 116B and in thermal contact with the third cold plate 112C. During operation of the component cooling apparatus 100, a fluid loop including a fluid pump and a radiator (not shown) is coupled between the fluid inlet 118A and the fluid outlet 118B via tubing or the like. The fluid pump causes a flow of a cooling fluid within the fluid manifold into the manifold inlet portion 116A. The cooling fluid is split through each of the first fluid passage 120A, second fluid passage 120B, and the third fluid passage 120C. The separate flows are merged within the manifold outlet portion 116B and output from the fluid outlet 118B to the radiator.

In an implementation, the flow of fluid through each of the first fluid passage 120A, second fluid passage 120B, and the third fluid passage 120C is varied by constructing the sizes of one or more the first fluid passage 120A, second fluid passage 120B, and the third fluid passage 120C to be different from one another to achieve a desired flow rate through each of the fluid passages 120A, 120B, and 120C. In a particular example, the first fluid passage 120A is sized to have a greater flow rate than the second fluid passage 120B and the third fluid passage 120C due to an expectation of the amount of heat transferred to the first fluid passage 120A being greater than that of the second fluid passage 120B and the third fluid passage 120C. In an implementation, a diameter of the first fluid passage 120A is greater than that of the second fluid passage 120B or the third fluid passage 120C. In another implementation, one or more controllable valves are positioned within one or more of the first fluid passage 120A, second fluid passage 120B, and the third fluid passage 120C to allow varying of the respective flow rates through the first fluid passage 120A, second fluid passage 120B, and the third fluid passage 120C. Although the implementation illustrated in FIG. 1 includes three fluid passages, other implementations have less than three or more than three fluid passages within the fluid manifold.

In an implementation, the component cooling apparatus 100 includes a first spring mechanism 122A disposed between the manifold inlet portion 116A and the third cold plate 112C, and a second spring mechanism 122B disposed between the manifold outlet portion 116B and the third cold plate 112C. In the implementation, the first spring mechanism 122A and second spring mechanism 122B are configured to exert a force between the fluid manifold and the third cold plate 112C to maintain thermal contact between the third cold plate 112C and the fourth base plate 108D. In an implementation, the component cooling apparatus 100 includes a third spring mechanism 122C and a fourth spring mechanism 122D disposed between the second cold plate 112B and the first cold plate 112A. The third spring mechanism 122C and a fourth spring mechanism 122D are configured to exert a force between the first cold plate 112A and the second cold plate 112B to maintain thermal contact between the first cold plate 112A and the first TEC 110A, and maintain thermal contact between the second cold plate 112B and the second TEC 110B. In an implementation, each of the first spring mechanism 122A, the second spring mechanism 122B, the third spring mechanism 122C, and the fourth spring mechanism 122D are coupled to a side portion of fluid manifold. In the implementation illustrated in FIG. 1, the first spring mechanism 122A and the third spring mechanism 122C are coupled to a side of the manifold inlet portion 116A, and the second spring mechanism 122B and the fourth spring mechanism 122D are coupled to a side of the manifold outlet portion 116B.

The example component cooling apparatus 100 of FIG. 1 provides for multiple heat conduction paths between heat transfer surfaces for removal of heat generated by the processor 106 as further described below. During operation of the processor 106, in an implementation an amount of heat generated by the processor is transferred to the first base plate 108A thermally coupled to the processor 106, and a portion of the heat transferred to the first base plate 108A is further transferred to the second base plate 108B. Each of the heat pipes 114A, 114B, 114C, and 114D is configured to transfer a portion of the heat received from the first base plate 108A and the second base plate 108B to the third base plate 108C and the fourth base plate 108D. In a particular implementation, the heat pipes 114A, 114B, 114C, and 114D employ a phase transition between a heat transfer fluid within the heat pipes 114A, 114B, 114C, and 114D to transfer heat from the first base plate 108A and the second base plate 108B to the third base plate 108C and the fourth base plate 108D.

In an implementation the first TEC 110A is controlled to remove an amount of heat from the second base plate 108B and transfer the heat to the first cold plate 112A. In an implementation, the amount of heat transferred by the first TEC 110A is controlled by adjusting a current provided to the first TEC 110A. In a particular implementation, the first TEC 110A provides sub-ambient temperature cooling to the second base plate 108B. In an implementation, the second TEC 110B is controlled to remove an amount of heat from the third base plate 108C and transfer the heat to the second cold plate 112B. In an implementation, the amount of heat transferred by the second TEC 110B is controlled by adjusting a current provided to the second TEC 110B. In a particular implementation, the second TEC 110B provides sub-ambient temperature cooling to the third base plate 108C. In one or more implementations, the amount of power provided to one or more of the first TEC 110A or the second TEC 110B is adapted based on monitored system parameters, such as processor activity, to control the amount of cooling provided by the respective TEC as further described herein.

In an implementation, the fluid pump causes a flow of a cooling fluid to enter the manifold inlet portion 116A through the fluid inlet 118A. The fluid is split to flow through each of the first fluid passage 120A, the second fluid passage 120B, and the third fluid passage 120C. The first fluid passage 120A is in thermal contact with the first cold plate 112A, the second fluid passage 120B is in thermal contact with the second cold plate 112B, and the third fluid passage 120C is in thermal contact with the third cold plate 112C. As fluid flows through the first fluid passage 120A, a portion of heat is transferred to the fluid from the first cold plate 112A. Similarly, as fluid flows through the second fluid passage 120B, a portion of heat is transferred to the fluid from the second cold plate 112B. As fluid flows through the third fluid passage 120C a portion of heat is transferred to the fluid from the third cold plate 112C. The separate flows from each of the first fluid passage 120A, the second fluid passage 120B, and the third fluid passage 120C are merged within the manifold outlet portion 116B and output from the fluid outlet 118B to one or more radiators.

Figure 2:
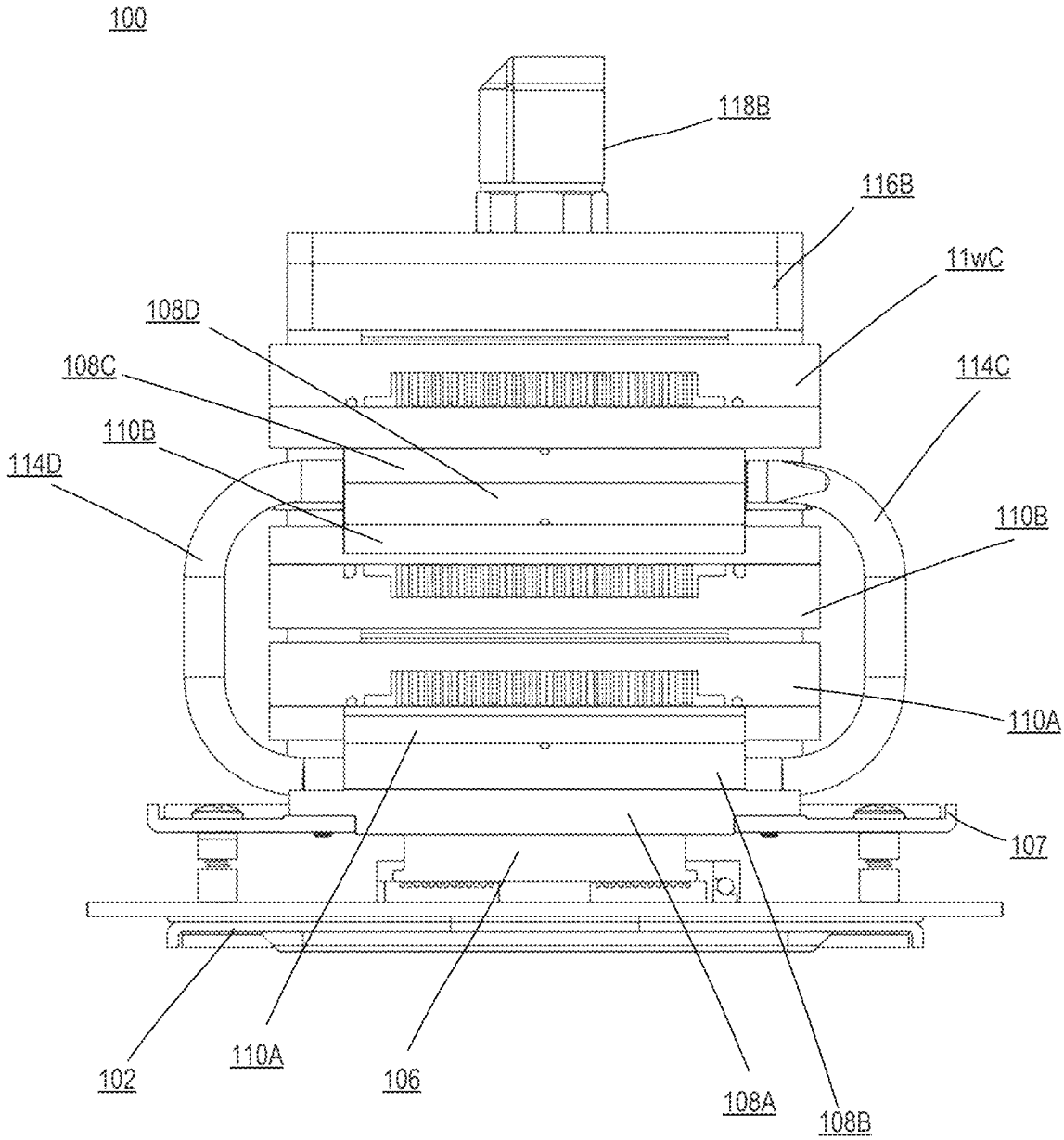
FIG. 2 is a side view of the component cooling apparatus of FIG. 1 according to implementations of the present disclosure.

For further explanation, FIG. 2 shows a side view of the component cooling apparatus 100 of FIG. 1 according to implementations of the present disclosure. FIG. 2 shows the heat pipes 114A, 114B, 114C, and 114D formed in a loop configuration. A first end of each of the heat pipes 114A, 114B, 114C, and 114D are in thermal contact with the first base plate 108A and the second base plate 108B. A second end of each of the heat pipes 114B, 114C, and 114D are in thermal contact with the third base plate 108C and the fourth base plate 108D.

Figure 3:
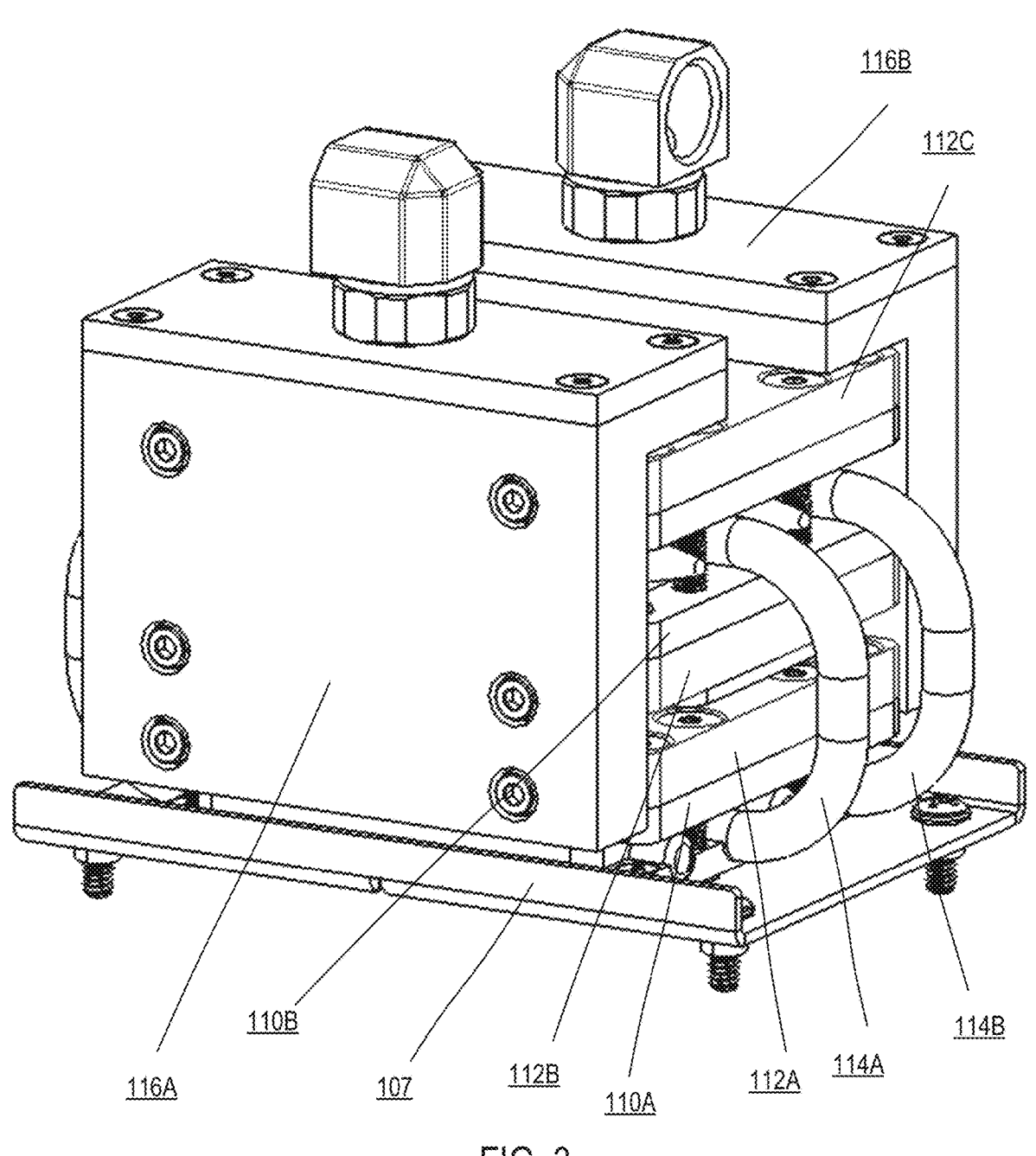
FIG. 3 is a perspective view of a portion of the component cooling apparatus of FIG. 1 according to implementations of the present disclosure.

For further explanation, FIG. 3 shows a perspective view of a portion of the component cooling apparatus 100 of FIG. 1 according to implementations of the present disclosure. FIG. 3 shows the component cooling apparatus uncoupled from the processor 106 and the substrate 102.

Figure 4:
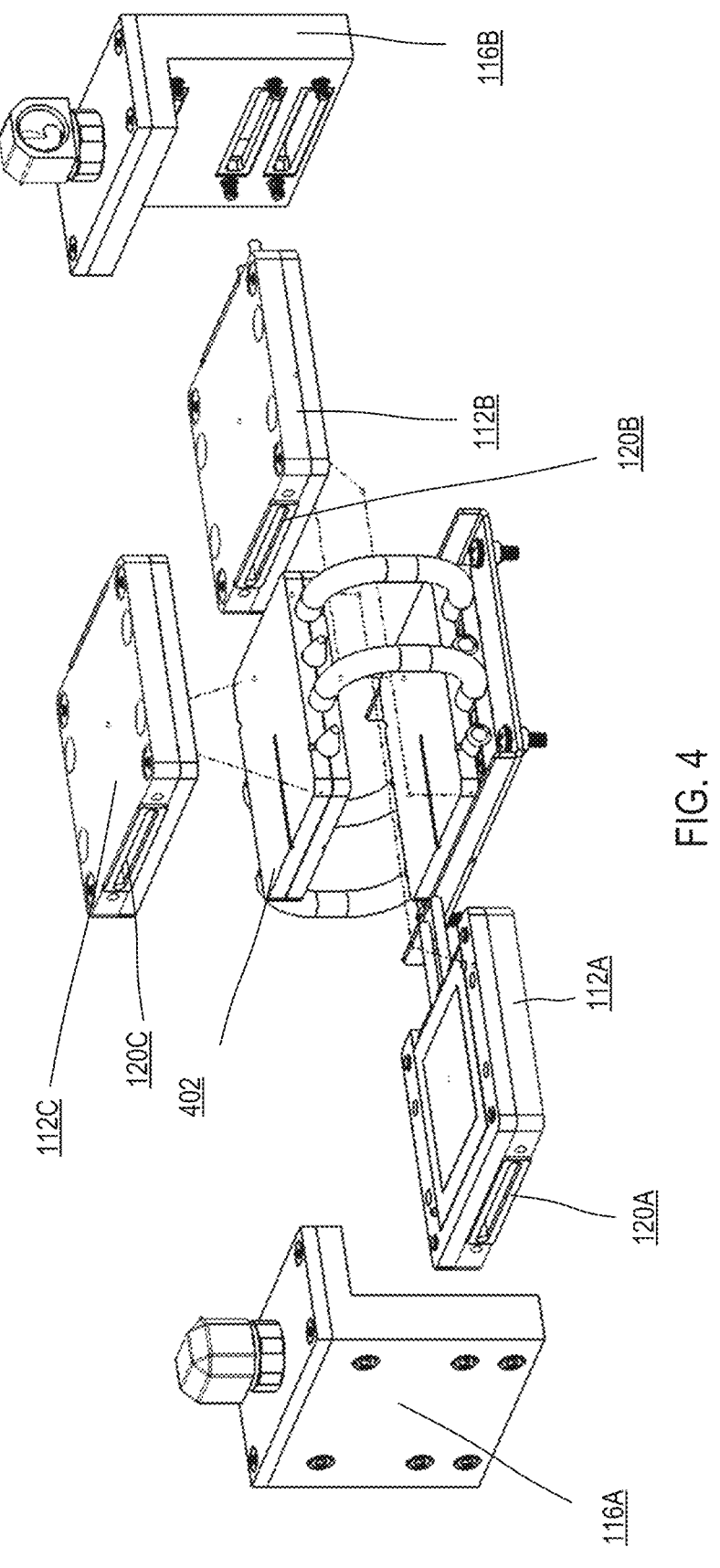
FIG. 4 is an exploded view of the portion of the component cooling apparatus of FIG. 3 according to implementations of the present disclosure.

For further explanation, FIG. 4 shows an exploded view of the portion of the component cooling apparatus of FIG. 3 according to implementations of the present disclosure. FIG. 4 shows the manifold inlet portion 116A and the manifold outlet portion 116B disconnected from the first cold plate 112A, the second cold plate 112B, and the third cold plate 112C. FIG. 4 further shows the first cold plate 112A, the second cold plate 112B, and the third cold plate 112C disconnected from the heat pipe assembly 402. The heat pipe assembly includes the heat pipes 114A-114D and base plates 108A-108D illustrated in FIG. 1. FIG. 4 further shows the first fluid passage 120A through the first cold plate 112A, the second fluid passage 120B through the second cold plate 112B, and the third fluid passage 120C through the third cold plate 112C.

Figure 5:
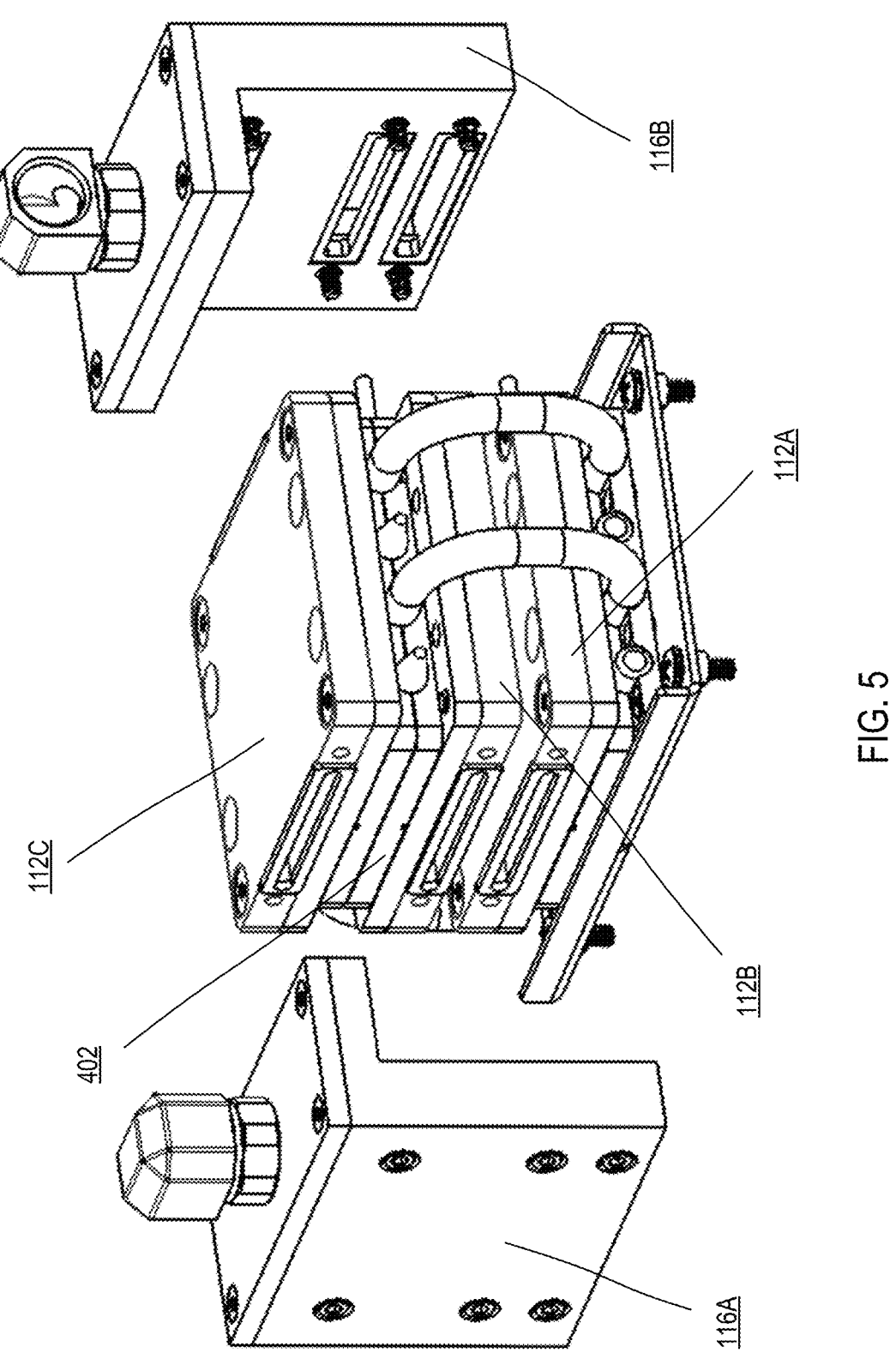
FIG. 5 is another exploded view of the portion of the component cooling apparatus of FIG. 3 according to implementations of the present disclosure.

For further explanation, FIG. 5 shows another exploded view of the portion of the component cooling apparatus of FIG. 3 according to implementations of the present disclosure. FIG. 5 shows the manifold inlet portion 116A and the manifold outlet portion 116B disconnected from the first cold plate 112A, the second cold plate 112B, and the third cold plate 112C. FIG. 5 further shows the first cold plate 112A, the second cold plate 112B, and the third cold plate 112C coupled to the heat pipe assembly 402.

Figure 6:
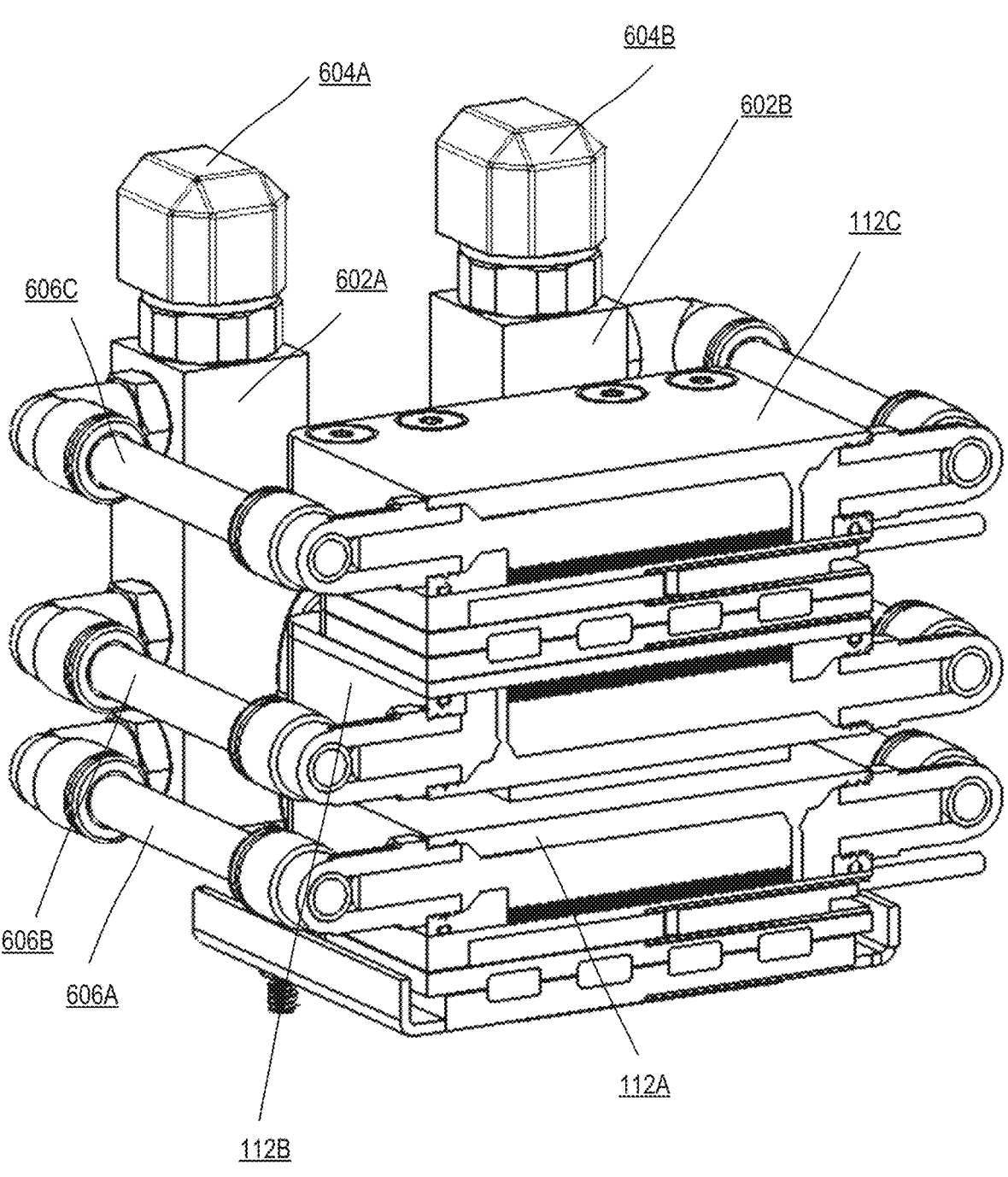
FIG. 6 is another implementation of a fluid manifold according to implementations of the present disclosure.

For further explanation, FIG. 6 shows another implementation of a fluid manifold 600 according to implementations of the present disclosure. FIG. 6 shows a cross-section view of the fluid manifold 600 as including a manifold inlet portion 602A and a manifold outlet portion 602B. The manifold inlet portion 602A includes a fluid inlet 604A, and the manifold outlet portion 602B includes a fluid outlet 604B. In an implementation, the fluid inlet 604A and the fluid outlet 604B are each positioned in the same direction. In other implementations, the fluid inlet 604A and the fluid outlet 604B are each positioned in any desired direction. The fluid manifold includes a first fluid passage 606A connecting the manifold inlet portion 602A to the manifold outlet portion 116B and in thermal contact with the first cold plate 112A. The fluid manifold includes a second fluid passage 606B connecting the manifold inlet portion 602A to the manifold outlet portion 602B and in thermal contact with the second cold plate 112B. The fluid manifold further includes a third fluid passage 606C connecting the manifold inlet portion 602A to the manifold outlet portion 602B and in thermal contact with the third cold plate 112C. In the implementation shown in FIG. 6, the manifold inlet portion 602A and the manifold outlet portion 602B are positioned behind and not in direct contact with the first cold plate 112A, the second cold plate 112B, and the third cold plate 112C.

Figure 7:
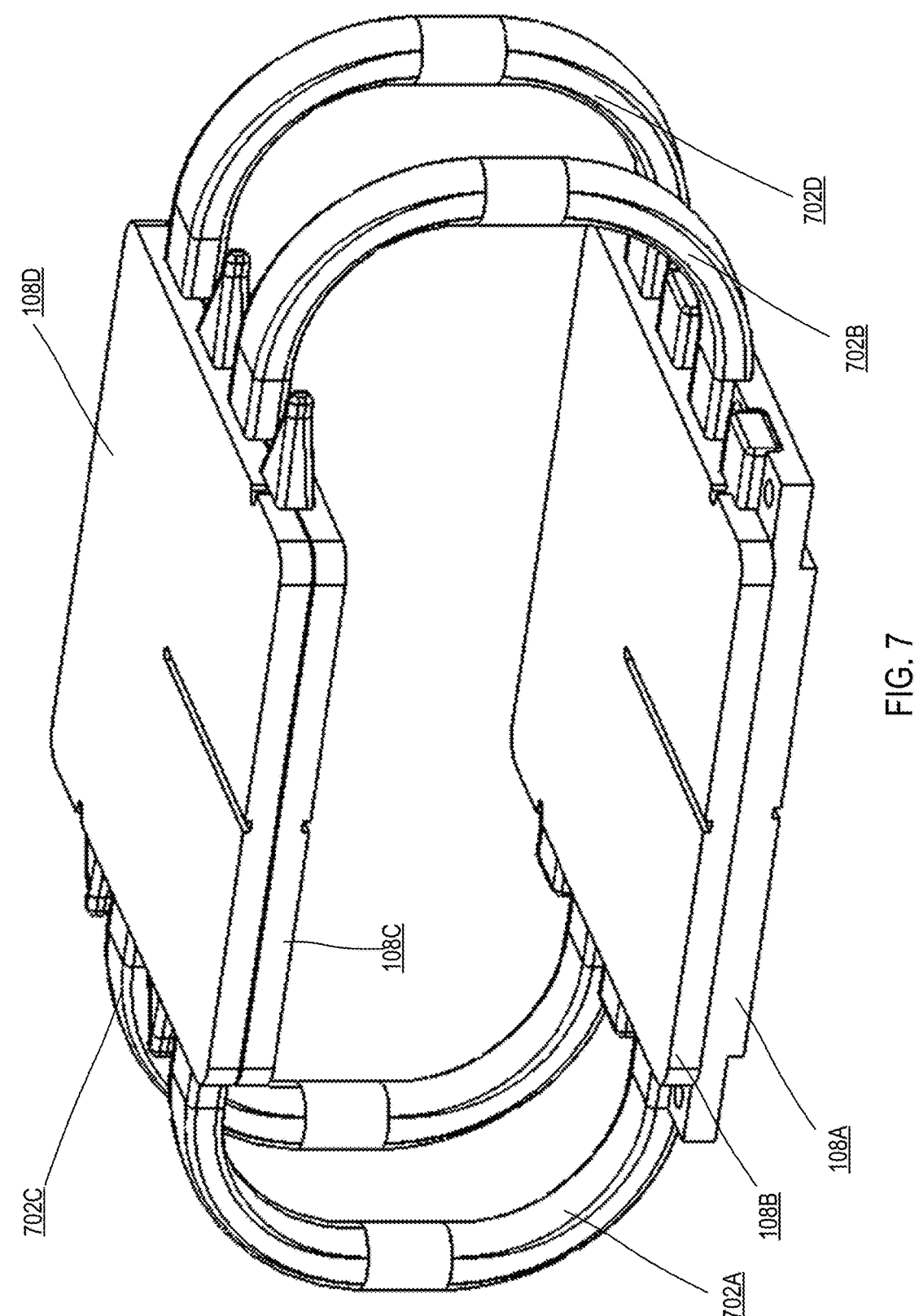
FIG. 7 is another implementation of a heat pipe assembly according to implementations of the present disclosure.

For further explanation, FIG. 7 shows another implementation of a heat pipe assembly 700 according to implementations of the present disclosure. The heat pipe assembly 700 includes a first heat pipe 702A, a second heat pipe 702B, a third heat pipe 702C, a fourth heat pipe 702D, the first base plate 108A, the second base plate 108B, the third base plate 108C, and the fourth base plate 108D. In the implementation illustrated in FIG. 7, the heat pipes 702A-702D have a substantially rectangular cross section. Each of the heat pipes 702A-702D include a first end in thermal contact with the first base plate 108A and the second base plate 108B, and a second end in thermal contact with the third base plate 108C and the fourth base plate 108D. Although various implementations show heat pipes having substantially circular and substantially rectangular cross sections, other implementations include heat pipes having any suitable cross-section.

Figure 8:
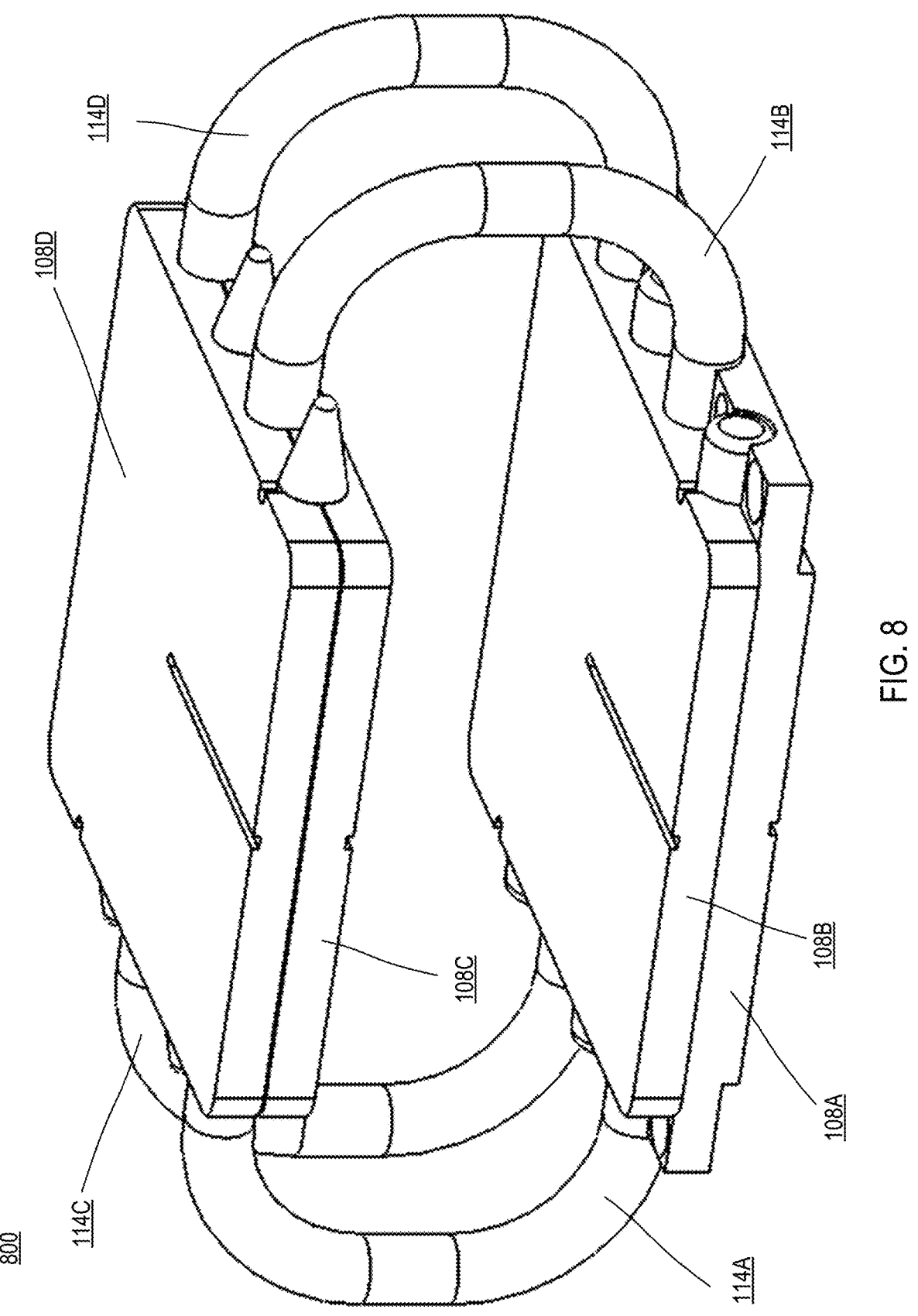
FIG. 8 is another implementation of a heat pipe assembly according to implementations of the present disclosure.

For further explanation, FIG. 8 shows another implementation of a heat pipe assembly 800 according to implementations of the present disclosure. The heat pipe assembly 800 includes the first heat pipe 114A, the second heat pipe 114B, the third heat pipe 114C, the fourth heat pipe 114D, the first base plate 108A, the second base plate 108B, the third base plate 108C, and the fourth base plate 108D. In the implementation illustrated in FIG. 8, the heat pipes 114A-114D have a substantially circular cross section. Each of the heat pipes 114A-114D include a first end in thermal contact with the first base plate 108A and the second base plate 108B, and a second end in thermal contact with the third base plate 108C and the fourth base plate 108D.

Figure 9:
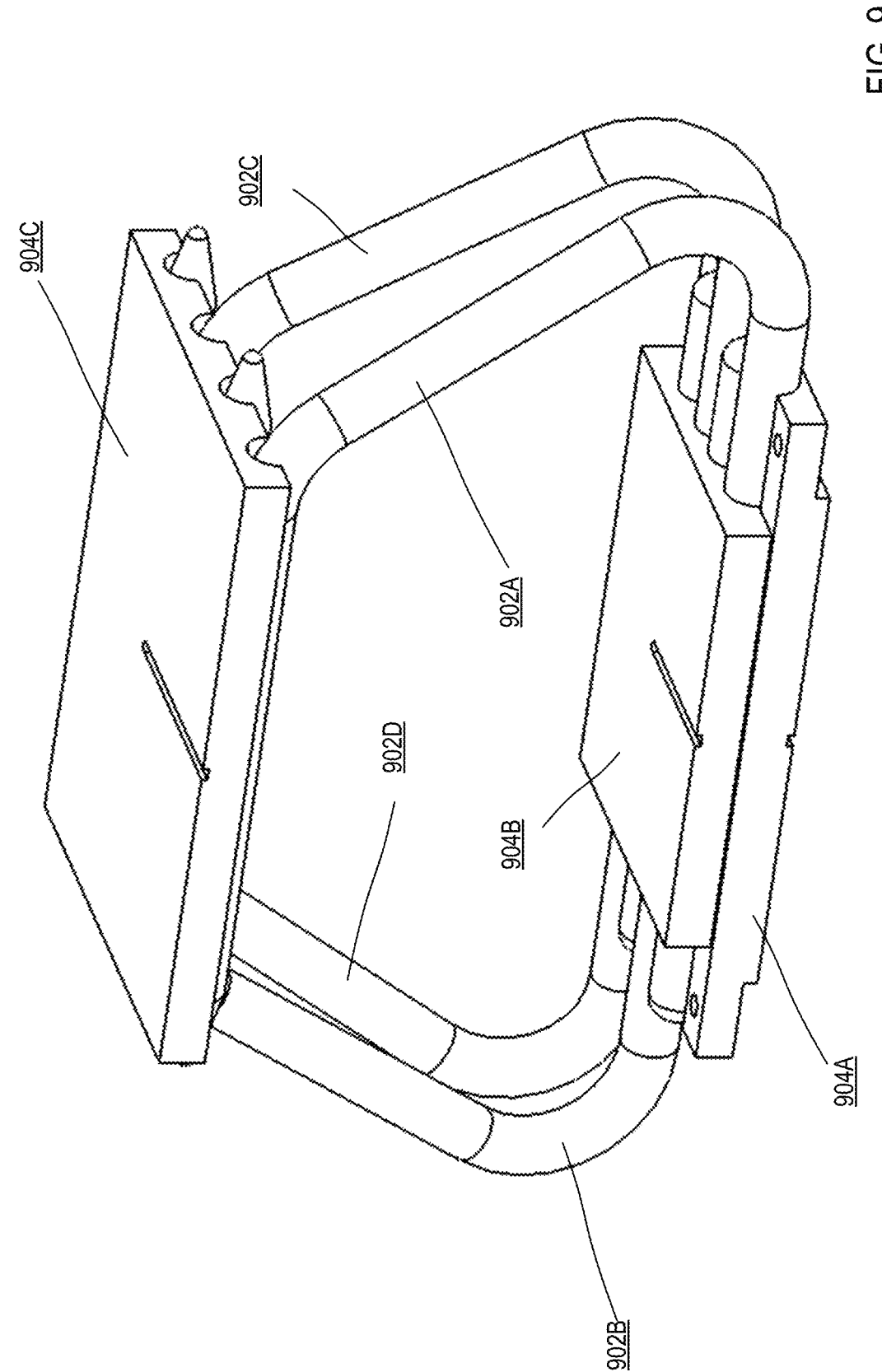
FIG. 9 is another implementation of a heat pipe assembly according to implementations of the present disclosure.

For further explanation, FIG. 9 shows another implementation of a heat pipe assembly 900 according to implementations of the present disclosure. The heat pipe assembly 900 includes a first heat pipe 902A, a second heat pipe 902B, a third heat pipe 902C, a fourth heat pipe 902D, a first base plate 904A, a second base plate 904B, and a third base plate 904C. In the implementation illustrated in FIG. 8, the heat pipes 902A-902D have a substantially circular cross section. In an implementation, the third base plate 904C has a larger surface area than those of the first base plate 904A and the second base plate 904B. Each of the heat pipes 902A-902D include a first end in thermal contact with the first base plate 904A and the second base plate 904B, and a second end in thermal contact with the third base plate 904C.

Figure 10:
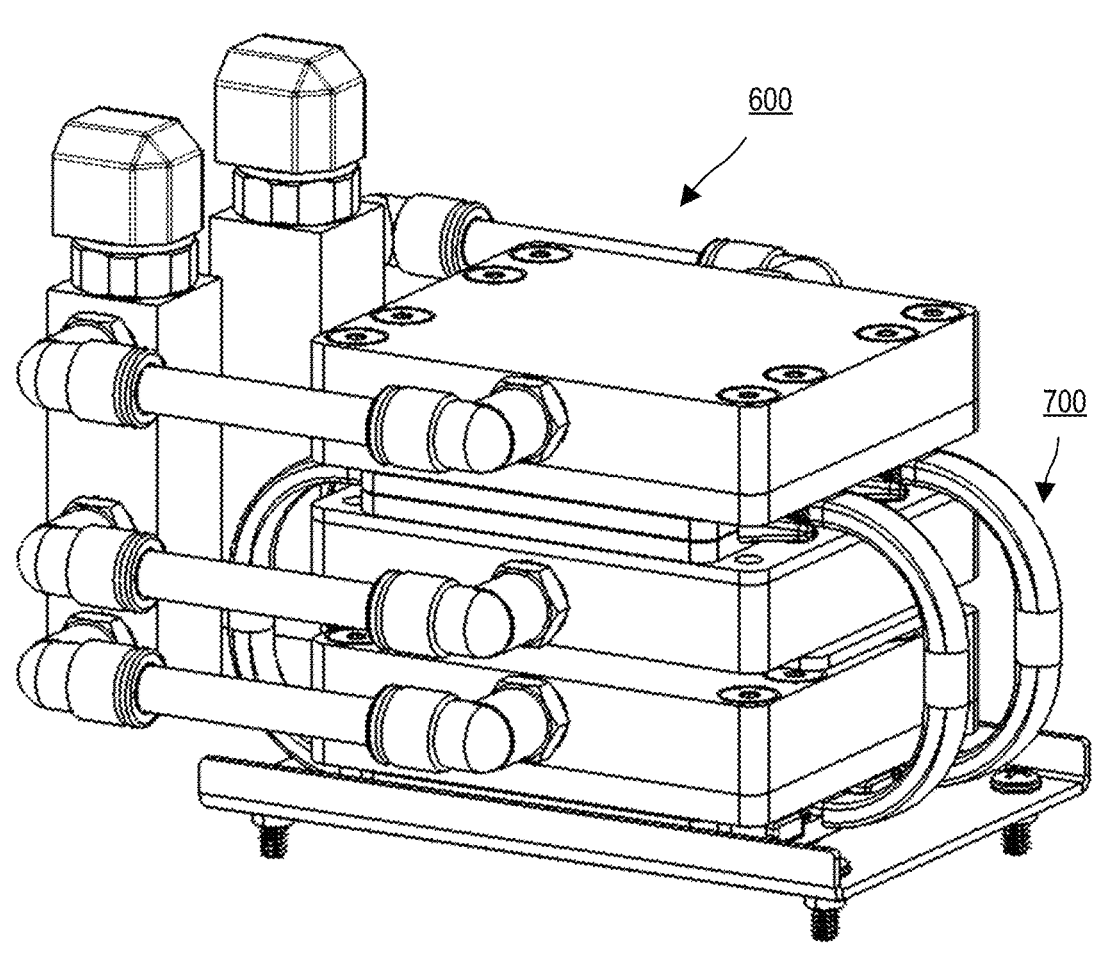
FIG. 10 is another example component cooling apparatus according to some implementations of the present disclosure.

For further explanation, FIG. 10 shows another example component cooling apparatus 1000 according to some implementations of the present disclosure. As shown in FIG. 10, the component cooling apparatus 1000 includes the fluid manifold 600 illustrated in FIG. 6 coupled with the heat pipe assembly 700 of FIG. 7.

Figure 11:
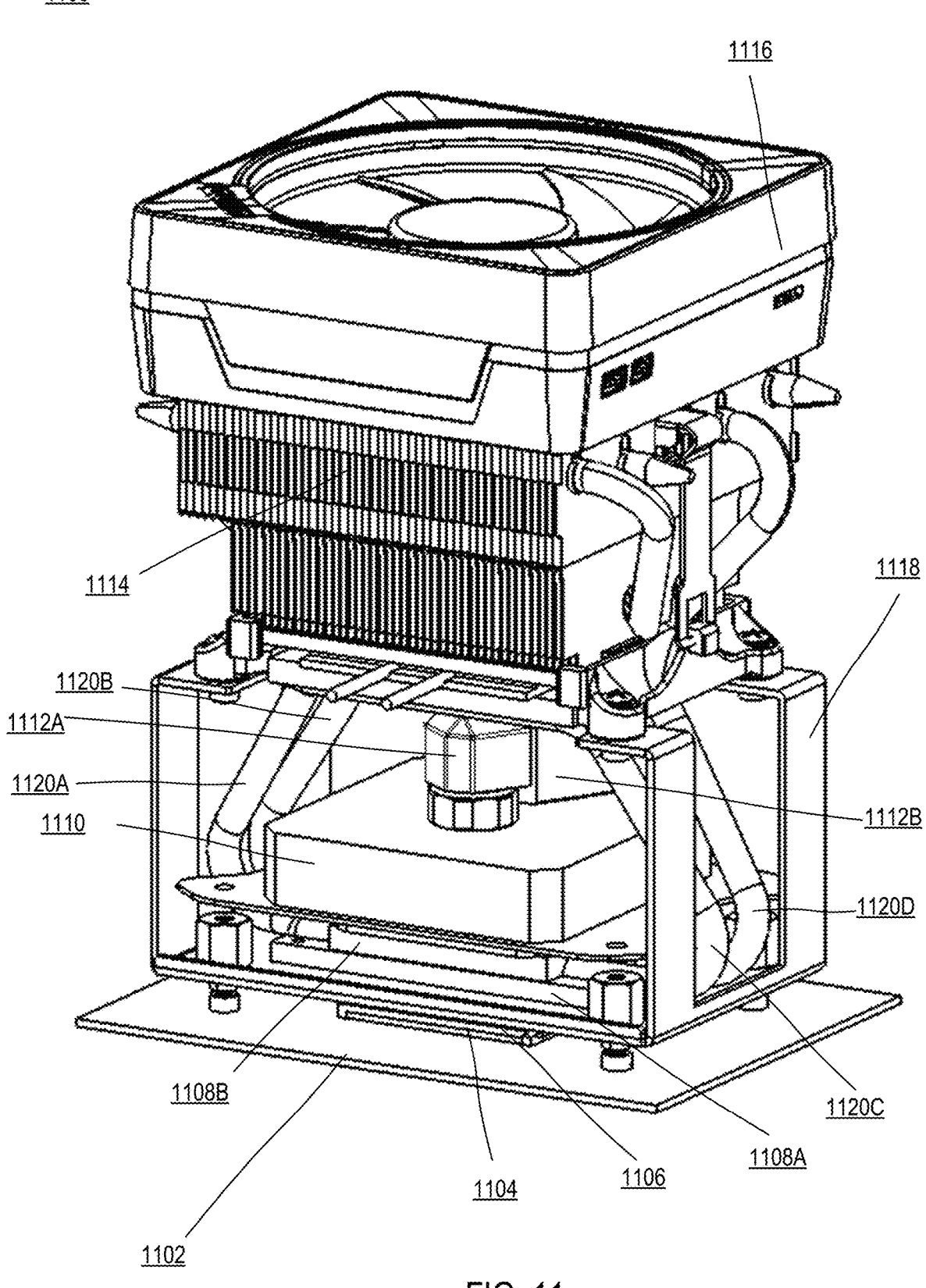
FIG. 11 is another example component cooling apparatus according to some implementations of the present disclosure.

For further explanation, FIG. 11 shows another example component cooling apparatus 1100 according to some implementations of the present disclosure. The example component cooling apparatus 1100 of FIG. 11 includes a substrate 1102 coupled to an IC socket 1104 which is further coupled to a processor 1106. The substrate 1102 includes, for example, a printed circuit board (PCB) such as a motherboard of a computing device. In various examples, the processor 1106 includes one or more of a CPU, an APU, or a GPU. A top surface the processor 1106 is thermally coupled to a bottom surface of a first base plate 1108A. In an implementation, the first base plate 1108A is connected to the substrate 1102 via one or more standoffs. A top surface of the first base plate 1108A is coupled to a bottom surface of a second base plate 1108B. In one or more implementations, the first base plate 1108A and the second base plate 1108B are constructed of a conductive metal such as copper. In an implementation, the first base plate 1108A and the second base plate 1108B are replaced with a single base plate.

A top surface of the second base plate 1108B is thermally coupled to a bottom surface of a fluid block 1110. The fluid block 1110 includes a fluid inlet 1112A and a fluid outlet 1112B. The fluid block 1110 includes a fluid passage extending from the fluid inlet 1112A to the fluid outlet 1112B and in thermal contact with the second base plate 1108B. During operation of the component cooling apparatus 1100, a fluid loop including a fluid pump and a radiator (not shown) is coupled between the fluid inlet 1112A and the fluid outlet 1112B via tubing or the like. The fluid pump causes a flow of a heat transfer medium, such as water, within the fluid block 1110 from the fluid inlet 1112A to the fluid outlet 1112B to facilitate removal of heat from the second base plate 1108B to the radiator.

The component cooling apparatus 1100 further includes a heat sink fin stack 1114 having a top surface coupled to a bottom surface of a cooling fan assembly 1116 configured to direct an air flow to the heat sink fin stack 1114. In an implementation, the heat sink fin stack 1114 includes a plurality of fins to facilitate removal of heat from the heat sink fin stack 1114 via the air flow. The heat sink fin stack 1114 is supported from the substrate 1102 via a support frame 1118. In an implementation, the heat sink fin stack 1114 is substantially larger than either of the first base plate 1108A or the second base plate 1108B.

The component cooling apparatus 1100 further includes multiple heat pipes 1120A, 1120B, 1120C, and 1120D. Each of the heat pipes 1120A, 1120B, 1120C, and 1120D has a first end disposed between and in thermal contact with the first base plate 1108A and the second base plate 1108B, and a second end in thermal contact with the heat sink fin stack 1114. Each of the heat pipes 1120A, 1120B, 1120C, and 1120D include a middle portion between the first end and the second end that is external to each of the base plates 1108A, 1108B and the heat sink fin stack 1114.

In one or more implementations, each of the heat pipes 1120A, 1120B, 1120C, and 1120D are formed in a half-loop configuration. In the implementation illustrated in FIG. 11, the heat pipes 1120A-1120D have a substantially circular cross section. In a particular implementation, the heat pipes 1120A and 1120B extend from a side of the component cooling apparatus 1100, and the heat pipes 1120C and 1120D extend from an opposite side of the component cooling apparatus 1100. Although various implementations are described as using heat pipes as heat transfer structures, other implementations utilize other suitable heat transfer structures such as vapor chambers.

The example component cooling apparatus 1100 of FIG. 11 provides for multiple heat conduction paths between heat transfer surfaces for removal of heat generated by the processor 1106 as further described below. During operation of the processor 1106, in an implementation an amount of heat generated by the processor 1106 is transferred to the first base plate 1108A thermally coupled to the processor 1106, and a portion of the heat transferred to the first base plate 1108A is further transferred to the second base plate 1108B. Each of the heat pipes 1120A, 1120B, 1120C, and 1120D is configured to transfer a portion of the heat received from the first base plate 1108A and the second base plate 1108B to the heat sink fin stack 1114. In a particular implementation, the heat pipes 1120A, 1120B, 1120C, and 1120D employ a phase transition between a heat transfer fluid within the heat pipes 1120A, 1120B, 1120C, and 1120D to transfer heat from the first base plate 1108A and the second base plate 1108B to the heat sink fin stack 1114.

In another implementation the component cooling apparatus 1100 further includes a TEC positioned between and in thermal contact with the second base plate 1108B and the fluid block 1110. In another implementation, the component cooling apparatus 1100 further includes a TEC positioned between and in thermal contact with the heat sink fin stack 1114 and the cooling fan assembly 1116.

Figure 12:
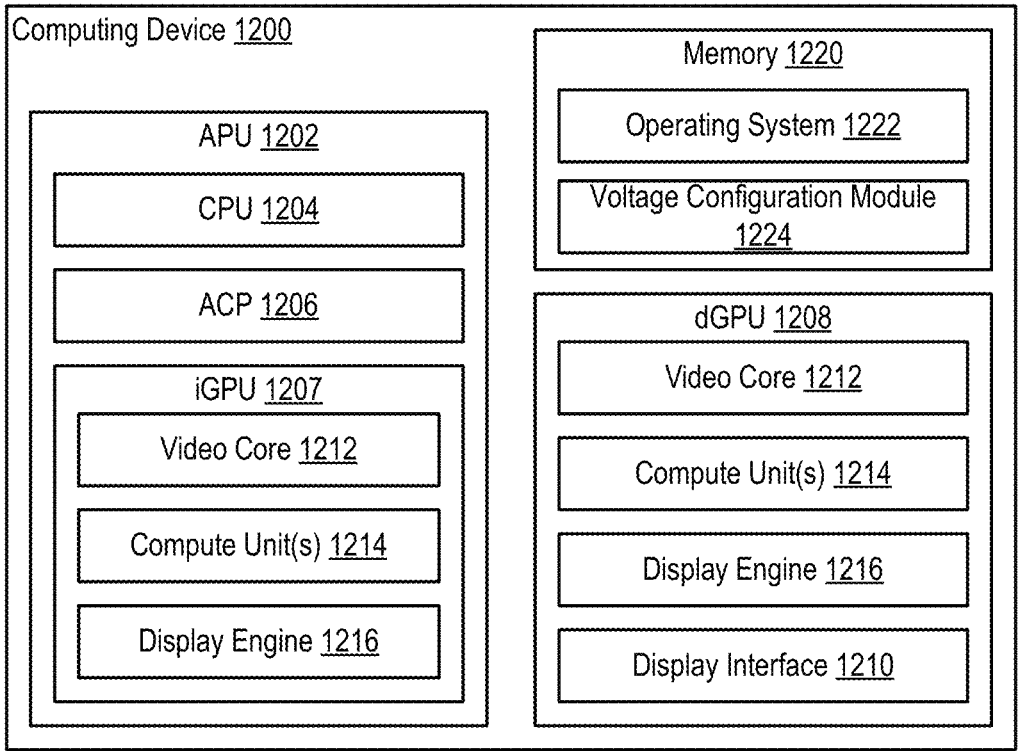
FIG. 12 is a block diagram of an example computing device for a component cooling apparatus according to some implementations.

FIG. 12 is a block diagram of an example computing device 1200 for a component cooling apparatus according to some implementations. The computing device 1200 includes an Accelerated Processing Unit (APU) 1202. The APU 1202 is a microprocessor that includes a central processing unit (CPU) 1204 and integrated graphics processing unit (iGPU) 1207 on a single die. The computing device 1200 also includes a discrete graphics processing unit (dGPU) 1208. Although the approaches set forth herein are described in the context of a computing device 1200 including a dGPU 1208 and an APU 1202 with an iGPU 1207, it is understood that the approaches set forth herein are applicable to any system or device incorporating both integrated and discrete GPUs. The dGPU 1208 is a peripheral or additional component of the computing device 1200 operatively coupled to the APU 1202. For example, in some implementations the dGPU 1208 is operatively coupled to the APU 1202 by a peripheral component interface express (PCIe) bus. Accordingly, in such an implementation, the dGPU 1208 is installed in a PCIe port on a motherboard or other printed circuit board (PCB) into which the APU 1202 is installed. By virtue of the operable connection between the APU 1202 and the dGPU 1208, the APU 1202 is capable of issuing instructions, rendering jobs, and the like, to the dGPU 1208. In some implementations, the dGPU 1208 includes a display interface 1210. The display interface 1210 is a port or socket to which an external monitor or display is connected. The display interface 1210 provides a video signal to the external display for presentation. The display interface 1210 includes, for example, a High Definition Multimedia Interface (HDMI) port, a Video Graphics Array (VGA) port, a Digital Visual Interface (DVI) port, a Universal Serial Bus C (USB-C) port, or other display port as can be appreciated.

The iGPU 1207 and dGPU 1208 each include one or more video cores 1212. A video core 1212 is a discrete processing unit, core, or other unit of hardware resources dedicated to encoding and decoding video data. For example, each video core 1212 facilitates video encoding or decoding operations such as decoding streaming video content, encoding video for video conferencing applications, encoding video files for later playback, and the like. In some implementations, the video core 1212 implements particular hardware architectures or configurations for video encoding and decoding, such as Video Core Next (VCN).

The iGPU 1207 and dGPU 1208 also each include one or more compute units 1214. Each compute unit 1214 includes one or more cores that share a local cache, allowing for parallel processing and cache access for each core within a given compute unit 1214. The compute units 1214 facilitate various calculations and processing jobs submitted to the iGPU 1207 and dGPU 1208, including rendering operations, machine learning operations, and the like.

The iGPU 1207 and dGPU 1208 also each include a display engine 1216. Each display engine 1216 manages the presentation of video or image content to a display of the computing device 1200 (e.g., an internal mobile device display or an external display coupled to a display interface 1210). In some implementations, the display engines 1216 implement display core technology such as Display Core Next (DCN) and the like. The APU 1202 also includes an audio co-processor (ACP) 1206. The ACP 1206 is a core, processor, or other allocation of hardware components dedicated to audio encoding and decoding.

The computing device 1200 also includes memory 1220 such as Random Access Memory (RAM). Stored in memory 1220 is an operating system 1222 and a voltage configuration module 1224. The operating system 1222 and voltage configuration module 1224 in the example of FIG. 12 are shown in memory 1220, but many components of such software typically are stored in non-volatile memory also, such as, for example, on a disk drive or other storage medium. Operating systems 1222 useful in the computing device 1200 according to certain implementations include UNIX™, Linux™, Microsoft Windows™, and others as will occur to those of skill in the art.

The voltage configuration module 1224 is a module for controlling the voltage allocated to the APU 1202 and dGPU 1208. For example, the voltage configuration module 1224 implements SmartShift technology to allocate voltage in order to increase performance for particular applications. Depending on the particular workload executed in the computing device 1200, the voltage configuration module 1224 increases or decreases the voltage used by the APU 1202 and dGPU 1208. As an example, for a workload that relies on the dGPU 1208 heavily, such as complex graphics rendering, the voltage configuration module 1224 will increase the voltage to the dGPU 1208. As another example, for a workload that relies on the APU 1202 more than the dGPU 1208 such as audio encoding, or when the computing device 1200 is in a low power consumption state, the voltage configuration module 1224 will increase the voltage to the APU 1202. In some implementations, an increase to the voltage of one component (e.g., to the APU 1202 and dGPU

1208) will cause or be performed in response to a decrease in the voltage of the other component.

In some implementations, a modification to the voltage of a given component will cause or be performed in response to a modification in operating frequency of the given component. For example, assume that a command or request is issued to increase the operating frequency of the dGPU 1208 in response to a rendering job being submitted to the dGPU 1208. The voltage configuration module 1224 will then increase the voltage provided to the dGPU 1208 so that the dGPU 1208 is able to operate at the increased frequency. In some implementations, the frequency of a given component is defined according to a frequency voltage curve. A frequency voltage curve defines a relationship between the frequency of a component and its corresponding voltage. In other words, the frequency voltage curve defines, for a given frequency, a corresponding voltage for the component.

One skilled in the art will appreciate that the voltage configuration module 1224 operates within various constraints for voltages in the computing device 1200. For example, in some implementations, the APU 1202 and dGPU 1208 have defined minimum and maximum safe voltages. One skilled in the art will appreciate that the particular voltage limits for the APU 1202 and dGPU 1208 are dependent on particular cooling and thermal solutions implemented in the computing device 1200.

One skilled in the art will also appreciate that the approaches described herein for a component cooler provide for increased cooling capabilities for the APU 1202 and dGPU 1208, allowing for increased maximum safe operational voltages for both the APU 1202 and dGPU 1208. Thus, a computational performance increase is achieved though the improved cooling approaches described herein.

The power used by TEC cooling is often a significant percentage of total power consumption in a computing system, for example greater than 50 Watts(W). The TEC cooler is typically powered by the same power supply as the rest of the system components, and the shared power supply is often in the same enclosure as all of the other components that it is desired to remove heat from. Managing this power to cool a computing system as efficiently as possible improves system performance and directly assists in keeping ambient air temperature down in the shared enclosure. In particular, it is desirable to utilize TEC cooling in use cases in which there is a user benefit. This is important, for example, in cases in which the system power supply is limited by size or cost. Existing solutions typically provide only discrete power levels of operation, rather than utilizing continuous feedback to optimize power consumption relative to cooling needs. Additionally, existing solutions do not consider non-CPU/APU power consumption of other system components in deciding what performance and power level the TEC should utilize.

One or more implementations provide for a control scheme for regulation TEC power, and therefore cooling capability, in response to utilized system power. In an implementation, CPU performance parameters such as APU/CPU power consumption, APU/CPU activity, DGPU (or multi-DGPU) power consumption, and junction temperatures are utilized to control an amount of cooling provided by the TEC device. One or more implementations minimize TEC power consumption dynamically while ensuring optimal cooling performance, and therefore maximize system performance across, for example, single-threaded/lightly threaded workloads, heavily threaded use cases, as well as gaming or other heavy GPU activity such as rendering or computer aided design (CAD). One or more implementations provide a user interface to allow a user to set operational limits and feedback response of the control system rather than simply choosing between discrete levels of operation of the component cooler. Accordingly, one or more implementations allow a user to tailor the thermal solution performance based on the user's system layout and component selection. In particular implementations, user-controlled parameters have pre-characterized limitations to minimize the potential for a user to inadvertently damaging the system by, for example, setting a temperature low enough to produce unwanted condensation or increasing TEC power draw above a threshold of safe operation.

One or more implementations provide for a TEC component cooler having the ability to adapt cooling capability to suit a variety of workload use cases by optimizing power utilization to suit the heat dissipation needs of the workloads that are running. In an implementation, for single threaded or lightly threaded CPU performance optimization, the main CPU/APU is aggressively cooled to improve peak maximum frequency (fmax) within minimal TEC power utilization. In another implementation, for a multi-threaded operation, the TEC power is managed based on system power draw and user-defined limits such as setting the TEC to use zero power if CPU power is high enough and no other system element is consuming a high amount of power. In another implementation, for graphics-heavy operation the TEC power is managed to provided chassis cooling to improve dGPU temperature/fmax. Various implementations utilize system parameters to monitor system behavior and respond to the monitored system parameters to maximize system performance and minimize system power while a TEC cooler is used for APU/CPU temperature control.

Figure 13:
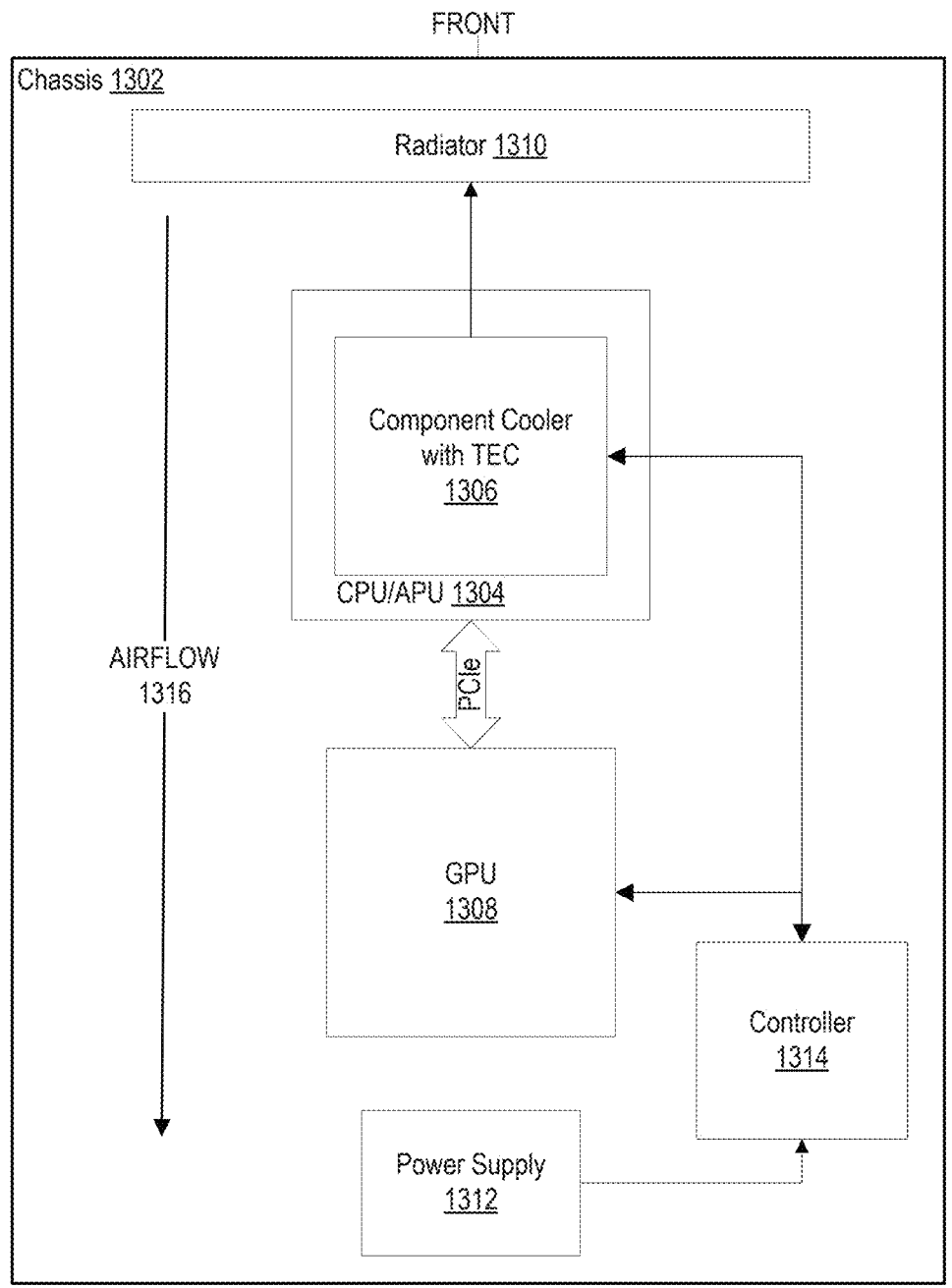
FIG. 13 is a block diagram of another example computing device for a component cooling apparatus according to some implementations.

FIG. 13 is a block diagram of another example computing device 1300 for a component cooling apparatus according to some implementations. The computing device 1300 includes a chassis 1302 having a CPU/APU 1304 and a component cooler with a TEC 1306 thermally coupled to the CPU/APU 1304 within the chassis 1302 to remove heat from the CPU/APU 1304. In one or more implementations, the component cooler with the TEC 1306 is one or more of the component coolers previously described with respect to FIGS. 1-10. In other implementations, the component cooler with the TEC 1306 includes any component cooler having at least one TEC device. The chassis 1302 of the computing device 1300 further includes a GPU 1308 in communication with the CPU/APU 1304 via a PCIe interface, and a radiator 1310 configured to remove heat received by the component cooler with the TEC 1306 from the CPU/APU 1304 via a heat transfer medium such as water, and dissipate the heat.

The chassis 1302 of the computing device 1300 further includes a power supply 1312 configured to provide power to various components of the computing device 1300 such as the CPU/APU 1304, the TEC of the component cooler with the TEC 1306, and the GPU 1308. The chassis 1302 of the computing device 1300 further includes a controller 1314 configured to control an amount of power the TEC draws from the power supply 1312 to the TEC of the component cooler with the TEC 1306. In an implementation, the controller 1314 is further configured to control an amount of power the other components of the computing device 1300 such as the CPU/APU 1304 and/or the GPU 1308 draw from the power supply 1312. In an implementation, the controller 1314 is a separate component of the computing device 1300. In another implementation, the functions of the controller 1314 are integrated with and performed by the CPU/APU 1304. In still another implementation, the functions of the controller 1314 are integrated with and performed by an CPU/APU system management component (SMU). An airflow 1316 is directed from the front to the back of the chassis 1302 to facilitate dissipation of heat from the chassis 1302. In an implementation, the chassis 1302 includes one or more fans to establish the airflow 1316.

In a first example use case according to some implementations, the APU/CPU 1304 is operating in a single-threaded or lightly-threaded workload with a boosted processor state (C-state). In the first example use case, a goal is to optimally reduce CPU/APU hotspot temperature to enable a highest possible C-state boost sustained frequency during lightly threaded CPU-centric workloads. In the first example use case, the controller 1314 receives system parameters from one or more of the CPU/APU 1304 and GPU 1308 indicative of processor activity and/or power consumption and determines a TEC power level to apply to the TEC of the component cooler with the TEC 1306. In a particular implementation of the first example use case, the controller 1314 determines the TEC power level from among a number of fixed, predetermined levels for optimal cooling depending upon the configuration of the computing device 1300 such as the configuration of the chassis 1302 and the configuration of the power supply 1312. In the first example use case, the controller 1314 determines that the power consumption of the CPU/APU 1304 is less than a predetermined level, e.g., thermal design power (TDP) based on received system parameters. The controller 1314 further determines that power consumption of the GPU 1308 is minimal, and that there are no other system power constraints. In the first example, the controller 1314 utilizes a feedback loop having CPU/APU die temperature and power consumption to determine a power level to provide to the TEC device from a pre-determined list of TEC power options stored, for example, in a BIOS, an SMU, or a driver. In an implementation, a user interface is provided to allow a user to modify the TEC power level as desired.

In a second example use case according to some implementations, the APU/CPU 1304 is operating at APU/CPU 1304 at a low power level (e.g., less than TDP) and the GPU 1308 is operating at a high power level such as for a gaming application or other GPU heavy performance application. In the second example use case, a goal is to optimally reduce ambient chassis temperature to allow for higher peak sustained GPU frequency with lightly threaded APU/CPU activity. Traditionally, the APU/CPU cooler responds only to APU/CPU temperature in terms of deciding how aggressively heat is removed from the components attached to the cooler. In this case, the APU/CPU temperatures are lower as a result of a low level of activity of the CPU/APU, which in turn results in the default behavior of the TEC doing very little cooling. In the second example use case, the controller 1314 controls the TEC power variably depending on the system power budget up to a pre-determined maximum for optimal chassis ambient cooling. Unlike a traditional heat sink and fan configuration, the TEC cooler in one or more implementations is able to blow cool air onto other components to which it is not connected. Even though the APU/CPU is not warm, the TEC is able to assist with the cooling of non-CPU components in the system, e.g., the GPU 1308. In the second example use case, system power constraints are such that power delivery is limited depending on specifications of the power supply 1312. In the second example use case, the controller 1314 implements control system requirements that include a feedback loop to control the TEC power based on CPU/APU die temperature and power level. In the second example use case, a system power monitor provides feedback to the controller 1314 (e.g., a CPU/APU SMU) that includes power consumption of one or more of the CPU/APU 1304, the TEC device of the component cooler with the TEC 1306, and the GPU 1308, as well as other system devices such as wireless cards, drives, memory, etc. In the second example use case, a BIOS or driver setting includes a power budget for safe operation of the power supply 1312 over fast and short durations as further described below.

In an implementation of the second example use case, the controller 1314 provides a fast control loop for system power exceeding the power budget over a short duration (e.g., less than 1 ms) and a slow control loop for system power exceeding the power budget over a long duration (e.g., less than 100 ms by greater than 1 ms). In an implementation, the controller 1314 (e.g., a SMU) implements the fast control loop by and generating a response to throttle CPU/APU power to reduce the system power to be less than the power budget. In an example implementation, the controller 1314 throttles CPU/APU power using a fast power throttling mechanism, such as by sending a signal to the CPU/APU 1304 to reduce its power consumption immediately (e.g., within microseconds). In another example implementation, the controller 1314 optionally throttles GPU 1308 via peak current control implemented by a voltage regulator connected to the GPU 1308 or by some other mechanism. In an implementation, the controller 1314 implements the slow control loop by generating a response to first throttle TEC power provided to the TEC of component cooler with the TEC 1306, then throttles CPU power provided to the CPU/APU 1304, and then throttles GPU power provided to the GPU 1308 as needed to maintain total system power under the power budget. In an implementation, a user interface is optionally provided to allow a user to modulate the system power budget and maximum TEC power.

In a third example use case according to some implementations, the APU/CPU 1304 is operating at APU/CPU 1304 at a high power level (e.g., TDP or higher) and the GPU 1308 is operating at a minimal power level such as for a multithreaded application. In the third example use case, a goal is to reduce CPU/APU hotspot temperature to enable the highest sustained frequency during fully threaded CPU-centric workloads. In the third example use case, the controller 1314 controls the TEC power at fixed, predetermined levels for optimal cooling depending on configuration of the chassis 1302 and capabilities of the power supply 1312. In an implementation, an option of TEC power=0 is provided for high CPU power use cases. In the third example use case, no system power constraints are required. In an implementation of the third example use case, the controller 1314 implements a feedback loop to control TEC power level based on CPU/APU die temperature and power consumption from among a predetermined list of TEC power options stored in, for example, the controller 1314, a BIOS, an SMU, or a driver. In an implementation of the third example use case, a user interface is optionally provided to allow a user to modify the TEC power level as desired.

In an implementation of the third example use case, if a predetermined CPU power level and/or temperature threshold is exceeded, the controller 1314 reduces the TEC power to zero. In an example implementation, a user interface is provided to allow a user to modify the predetermined CPU power level/temperature threshold. In another implementation of the third use case, the implementations of the first use case and the second use case are combined as a continuous response to detected CPU/APU power such that the higher the CPU/APU power, the lower the TEC power (e.g., until TEC power=0). In an implementation, a user interface is optionally provided to allow a user to specify a static TEC power vs. a continuous range in TEC power in response to CPU/APU power.

In a fourth example use case according to some implementations, the APU/CPU 1304 is operating at a high power level (e.g., at TDP or above) and the GPU 1308 is operating at a high power level. In the fourth example use case, a goal is to optimally provide for peak application performance when the both the APU/CPU 1304 and the GPU 1308 is operating at a high power level. In the fourth example use case, the controller 1314 controls the TEC power variably depending on the system power budget up to a pre-determined maximum for optimal chassis ambient cooling. In some implementations, the TEC power is expected to be set to zero or low overall. In the fourth example use case, system power constraints are such that power delivery is limited depending on specifications of the power supply 1312. In the fourth example use case, the controller 1314 implements control system requirements that include a feedback loop to control the TEC power based on CPU/APU die temperature and power level. In the fourth example use case, a system power monitor provides feedback to the controller 1314 (e.g., a CPU/APU SMU) that includes power consumption of one or more of the CPU/APU 1304, the TEC device of the component cooler with the TEC 1306, and the GPU 1308, as well as other system devices such as wireless cards, drives, memory, etc. In the fourth example use case, a BIOS or driver setting includes a power budget for safe operation of the power supply 1312 over fast and short durations.

In an implementation of the fourth example use case, the controller 1314 provides a fast control loop for system power exceeding the power budget over a short duration (e.g., less than 1 ms) and a slow control loop for system power exceeding the power budget over a long duration (e.g., less than 100 ms by greater than 1 ms). In an implementation, the controller 1314 (e.g., a SMU) implements the fast control loop by and generating a response to throttle CPU/APU power to reduce the system power to be less than the power budget. In an example implementation, the controller 1314 throttles CPU/APU power using a fast power throttling mechanism. In another example implementation, the controller 1314 optionally throttles GPU 1308 via peak current control or by some other mechanism. In an implementation, the controller 1314 implements the slow control loop by generating a response to first throttle TEC power provided to the TEC of the component cooler with the TEC 1306, then throttles CPU power provided to the CPU/APU 1304, and then throttles GPU power provided to the GPU 1308 as needed to maintain total system power under the power budget. In an implementation, a user interface is optionally provided to allow a user to modulate the system power budget and maximum TEC power.

Figure 14:
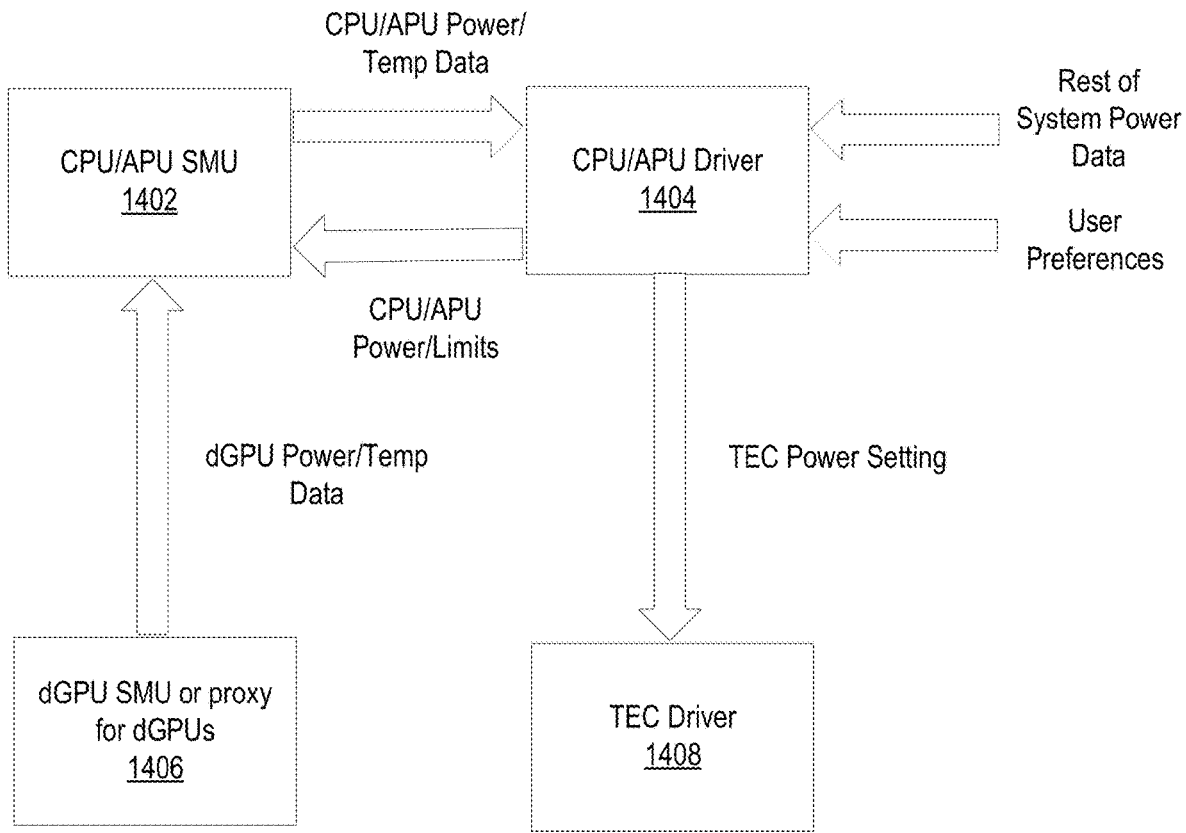
FIG. 14 is a block diagram of an example of system control elements for a component cooling apparatus according to some implementations.

FIG. 14 is a block diagram of an example of system control elements 1400 for a component cooling apparatus according to some implementations. The system control elements 1400 include a CPU/APU SMU 1402, a CPU/APU Driver 1404, a dGPU SMU or proxy for dGPUs 1406, and a TEC driver 1408. In the implementation of FIG. 14, the CPU/APU driver 1404 functions as the controller 1314 of FIG. 13 by maintaining information about the system power and temperature of key elements and directing the TEC power and the CPU/APU power limits accordingly. The CPU/APU SMU 1402 receives dGPU power and/or temperature data from the dGPU SMU or proxy for dGPUs 1406. The CPU/APU driver 1404 receives the CPU/APU power and/or temperature data from the CPU/APU SMU 1402, and the rest of system power data from other components of the system. Based on the various power and/or temperature inputs received by the CPU/APU driver 1404, the CPU/APU driver 1404 provides CPU/APU power limits to the CPU/APU SMU 1402 for controlling the power provided to the CPU/APU 1304, and sends a TEC power setting to the TEC driver 1408. The TEC driver 1408 sets the power level of the TEC device according to the TEC power setting. In an implementation, the CPU/APU driver 1404 optionally receives user preferences for setting TEC power levels and/or power budget thresholds as previously with respect to FIG. 13.

In an example operation of FIG. 14, if the CPU/APU driver 1404 determines that CPU/APU power is below a first predetermined threshold, the CPU/APU driver 1404 assumes that the either the first example use case or the second example use case described above is to be configured as the operating mode of the system. If the CPU/APU driver 1404 determines dGPU power is below a second predetermined threshold, the CPU/APU driver 1404 determines that the operating mode is the first example use case and sets the TEC power accordingly. If the CPU/APU driver 1404 determines dGPU power is equal to or above the second predetermined threshold, the CPU/APU driver 1404 determines that the operating mode is the second example use case and sets the TEC power accordingly. If the CPU/APU driver 1404 determines that the CPU/APU power is equal to or above the first predetermined threshold, the CPU/APU driver 1404 assumes that either the third example use case or the fourth example use case described above is to be configured as the operating mode of the system. If the CPU/APU driver 1404 determines dGPU power is below the second predetermined threshold, the CPU/APU driver 1404 determines that the operating mode is the third example use case and sets the TEC power accordingly. If the CPU/APU driver 1404 determines dGPU power is equal to or above the second predetermined threshold, the CPU/APU driver 1404 determines that the operating mode is the fourth example use case and sets the TEC power accordingly.

One or more implementations of FIG. 14 provide for one or more of the following advantages: (1) the implementation is agnostic of dGPU type; and (2) the implementation is flexible in terms of user-specific programmable behaviors via a user interface or a utility that interacts with the CPU/APU driver 1404.

Figure 15:
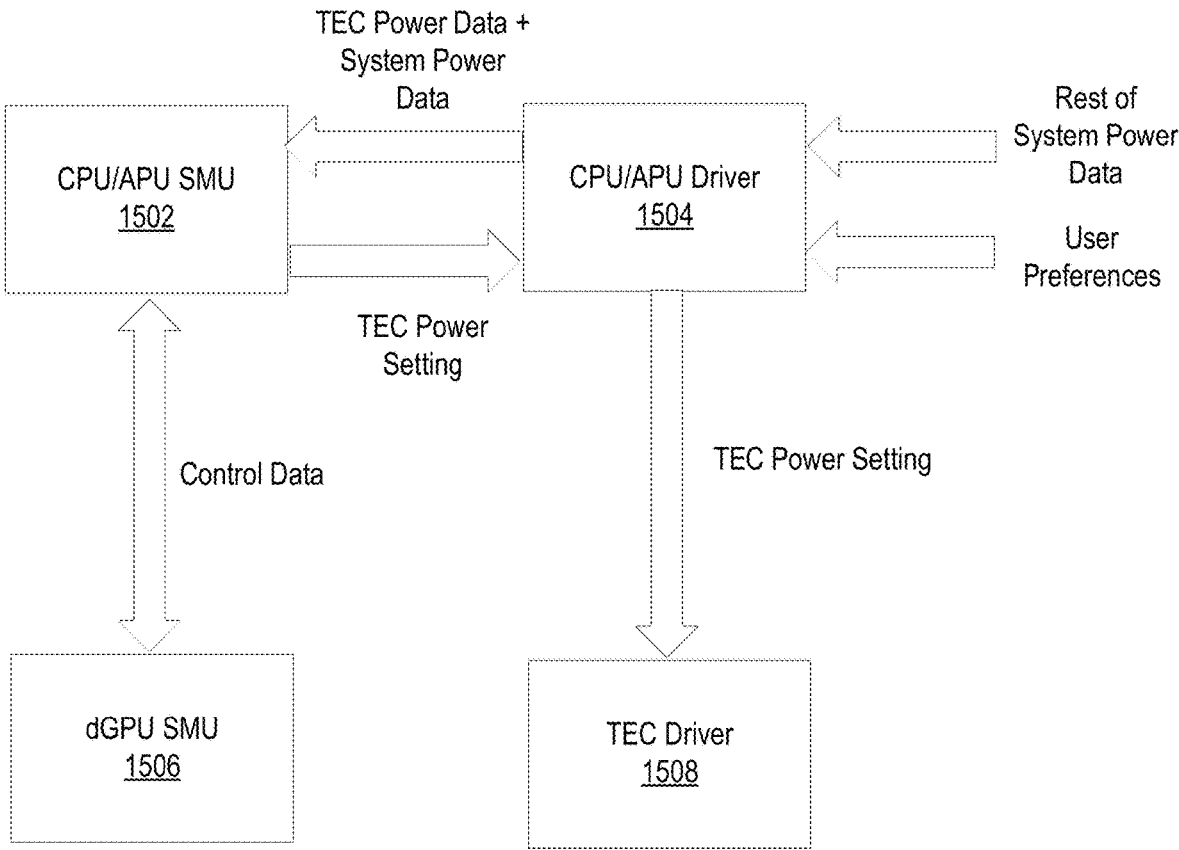
FIG. 15 is a block diagram of another example of system control elements for a component cooling apparatus according to some implementations.

FIG. 15 is a block diagram of another example of system control elements 1500 for a component cooling apparatus according to some implementations. The system control elements 1500 include a CPU/APU SMU 1502, a CPU/APU Driver 1504, a dGPU SMU 1506, and a TEC driver 1408. In the implementation of FIG. 15, the CPU/APU SMU 1502 functions as the controller 1314 of FIG. 13 by maintaining information about the system power and temperature of key elements and directing the TEC power and the CPU/APU power limits accordingly. The CPU/APU SMU 1502 receives control data including dGPU power and/or temperature data from the dGPU SMU 1506. The CPU/APU driver 1404 receives TEC power data from the TEC driver 1508 and the rest of system power data from other components of the system. The CPU/APU driver 1504 provides the TEC power data and the system power data to the CPU/APU SMU 1502. The CPU/APU SMU uses the APU power, the dGPU power, and the TEC power to implement a control scheme as described with respect to FIG. 13 to identify a use case and determine a TEC power setting based upon the identified use case. In an implementation, the CPU/APU SMU 1502 optionally incorporates the rest of system power to determine the control scheme. The CPU/APU sends the TEC power setting to the CPU/APU driver 1504, and the CPU/APU driver 1504 sends the TEC power setting to the TEC driver 1508. The TEC driver 1508 sets the power level of the TEC device according to the TEC power setting. In an implementation, the CPU/APU driver 1504 optionally receives user preferences for setting TEC power levels and/or power budget thresholds as previously with respect to FIG. 13.

One or more implementations of FIG. 15 provide for one or more of the following advantages: (1) fast response times to system state changes (e.g., tens of milliseconds) which is most beneficial for the second example use case; and (2) the implementation is flexible in terms of user-specific programmable behaviors via a user interface or a utility that interacts with the CPU/APU driver 1504.

Although the implementations of FIGS. 14 and 15 are described as either the CPU/APU driver 1404 or the CPU/APU SMU 1502 functioning as the controller 1314 of FIG. 13, in other implementations the controller 1314 may be embodied as a standalone component or within another component of the system.

For further explanation, FIG. 16 sets forth a flow chart illustrating an example method for component cooling according to some implementations. The method includes receiving 1602, by the controller 1314, at least one first parameter indicative of a first activity level of a first processor thermally coupled to the thermoelectric cooling (TEC) device. In an implementation, the first processor includes at least one of a central processing unit (CPU) and an accelerated processing unit (APU). In an implementation, the first parameter includes at least one of a first temperature associated with the first processor and a first power consumption of the first processor.

The method further includes determining 1604, by the controller 1314, a TEC power level from among a plurality of TEC power levels based on the at least one first parameter. The method further includes controlling 1606, by the controller, providing of power to the TEC device at the determined TEC power level. In an implementation, the TEC device is configured to transfer an amount of heat from the first processor to a heat transfer element based on the determined TEC power level.

For further explanation, FIG. 17 sets forth a flow chart illustrating another example method for component cooling according to some implementations. The method includes receiving 1702, by the controller 1314, at least one first parameter indicative of a first activity level of a first processor thermally coupled to the thermoelectric cooling (TEC) device. In an implementation, the first processor includes at least one of a central processing unit (CPU) and an accelerated processing unit (APU). In an implementation, the first parameter includes at least one of a first temperature associated with the first processor and a first power consumption of the first processor. The method further includes receiving 1704, by the controller 1314, at least one second parameter indicative of a second activity level of a second processor. In an implementation, the second processor includes a graphics processing unit (GPU).

The method further includes receiving 1706 system power data indicative of a power consumption of one or more system components other than the first processor and the second processor. The method further includes determining 1708, by the controller 1314, a TEC power level from among a plurality of TEC power levels based on the at least one first parameter, the at least one second parameter, and the system power data.

The method further includes controlling 1710, by the controller 1314, providing of power to the TEC device at the determined TEC power level. In an implementation, the TEC device is configured to transfer an amount of heat from the first processor to a heat transfer element based on the determined TEC power level.

In an implementation, the method further includes determining, using a first control loop, that total system power exceeds a first power budget, and throttling power provided to the first processor based on the determination that the total system power exceeds the first power budget. In an implementation, the method further includes determining, using a second control loop, that total system power exceeds a second power budget, and throttling power provided to at least one of the TEC device, the first processor, and the second processor based on the determination that the total system power exceeds the second power budget.

In view of the explanations set forth above, readers will recognize that the benefits of a component cooler for computing devices include:

Improved performance of a computing system by allowing for improved cooling of processors and other heat-generating components.

Minimization of unnecessary TEC power draw, particularly in cases where air cooling performance is the same or superior to TEC cooler performance.

Allowing the cooler to operation as a mechanism to lower the ambient temperature within the chassis for cases in which the APU/CPU is not the primary driver of workload performance (e.g., when a dGPU is running a game, rendering a 3D model, etc.).

Allowing user customization of the thermal control system response to monitored system parameters in order to best suit system needs. This is particularly helpful in systems that have limited power supply delivery capability, limited size, or that are attempting to operate silently/quietly as opposed to maximum performance.

Exemplary implementations of the present disclosure are described largely in the context of a fully functional computer system for a component cooler for computing devices. Readers of skill in the art will recognize, however, that the present disclosure also can be embodied in a computer program product disposed upon computer readable storage media for use with any suitable data processing system. Such computer readable storage media can be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the disclosure as embodied in a computer program product. Persons skilled in the art will recognize also that, although some of the exemplary implementations described in this specification are oriented to software installed and executing on computer hardware, nevertheless, alternative implementations implemented as firmware or as hardware are well within the scope of the present disclosure.

The present disclosure can be a system, a method, and/or a computer program product. The computer program product can include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some implementations, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to implementations of the disclosure. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various implementations of the present disclosure. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes can be made in various implementations of the present disclosure. The descriptions in this specification are for purposes of illustration only and are not to be construed in a limiting sense. The scope of the present disclosure is limited only by the language of the following claims.

What is claimed is:

1. An apparatus for component cooling, comprising:

a thermoelectric cooling (TEC) device configured to be thermally coupled to a first system component, wherein the first system component comprises a first processor, and wherein the TEC device is configured to cool the first system component; and a controller comprising a processor and memory storing instructions executable to: receive at least one first parameter indicative of a first activity level of the first processor; receive at least one second parameter indicative of a second activity level of a second system component, wherein the second system component is physically separate from the TEC device, and wherein the TEC device is configured to cool the second system component; determine a TEC power level from among a plurality of TEC power levels based on the at least one first parameter and on the at least one second parameter; and control providing of power to the TEC device at the determined TEC power level.

2. The apparatus of claim 1, wherein the second system component is located within a shared thermal environment, and wherein the TEC power level is selected to reduce ambient air temperatures surrounding both the first system component and the second system component.

3. The apparatus of claim 1, wherein the first processor comprises an accelerated processing unit (APU).

4. The apparatus of claim 1, where the controller is further configured to receive system power data indicative of a power consumption of one or more system components other than the first processor and the second system component.

5. The apparatus of claim 4, wherein the controller is further configured to determine the TEC power level based on the system power data.

6. The apparatus of claim 1, wherein the controller is further configured to: determine, using a second control loop, that total system power exceeds a second power budget, and throttle power provided to at least one of the TEC device, the first processor, and the second system component based on the determination that the total system power exceeds the second power budget.

7. The apparatus of claim 1, wherein the second processor includes a graphics processing unit (GPU).

8. The apparatus of claim 1, wherein the controller is further configured to:

determine, using a first control loop, that total system power exceeds a first power budget, and throttle power provided to the first processor based on the determination that the total system power exceeds the first power budget.

9. The apparatus of claim 1, wherein the first processor includes a central processing unit (CPU).

10. The apparatus of claim 1, wherein the at least one first parameter includes at least one of a first temperature associated with the first processor and a first power consumption of the first processor.

11. A system comprising:

a first processor;

a thermoelectric cooling (TEC) device configured to be thermally coupled to the first processor, and wherein the TEC device is configured to cool the first processor;

a second processor;

a power supply; and a controller comprising a processor and memory storing instructions executable configured to:

receive at least one first parameter indicative of a first activity level of the first processor;

receive at least one second parameter indicative of a second activity level of the second processor, wherein the second processor is physically separate from the TEC device, and wherein the TEC device is configured to cool the second processor;

determine a TEC power level from among a plurality of TEC power levels based on the at least one first parameter and the at least one second parameter; and control providing of power to the TEC device from the power supply at the determined TEC power level.

12. The system of claim 11, wherein the TEC device is configured to transfer an amount of heat from the first processor to a heat transfer element based on the determined TEC power level.

13. The system of claim 11, wherein the controller is further configured to receive system power data indicative of a power consumption of one or more system components other than the first processor and the second processor.

14. The system of claim 13, wherein the controller is further configured to determine the TEC power level based on the system power data.

15. The system of claim 11, wherein the first processor includes at least one of a central processing unit (CPU) and an accelerated processing unit (APU), and the second processor includes a graphics processing unit (GPU).

16. A method for component cooling, comprising:

receiving, by a controller, at least one first parameter indicative of a first activity level of a first processor thermally coupled to a thermoelectric cooling (TEC) device, and wherein the TEC device is configured to cool the first processor;

receiving, by the controller, at least one second parameter indicative of a second activity level of a second system component, wherein the second system component is, physically separate from the TEC device, and wherein the TEC device is configured to cool the second system component;

determining, by the controller, a TEC power level from among a plurality of TEC power levels based on the at least one first parameter and the at least one second parameter; and controlling, by the controller, providing of power to the TEC device at the determined TEC power level.

17. The method of claim 16, wherein the second system component comprises a second processor.

18. The method of claim 17, further comprising receiving system power data indicative of a power consumption of one or more system components other than the first processor and the second processor, wherein the determining of the TEC power level is further based on the system power data.

19. The method of claim 16, further comprising:

determining, using a first control loop, that total system power exceeds a first power budget; and throttling power provided to the first processor based on the determination that the total system power exceeds the first power budget.

\* \* \* \* \*